(12) United States Patent
Finarelli

(10) Patent No.: US 11,495,517 B2
(45) Date of Patent: Nov. 8, 2022

(54) PACKAGING METHOD AND JOINT TECHNOLOGY FOR AN ELECTRONIC DEVICE

(71) Applicant: Finar Module Sagl, Lugano (CH)

(72) Inventor: Daniele Gianluigi Finarelli, Lugano (CH)

(73) Assignee: FINAR MODULE SAGL, Lugano (CH)

( * ) Notice: Subject to any disclaimer, the term of this patent is extended or adjusted under 35 U.S.C. 154(b) by 411 days.

(21) Appl. No.: 16/647,214

(22) PCT Filed: Sep. 17, 2018

(86) PCT No.: PCT/EP2018/075059
§ 371 (c)(1),
(2) Date: Mar. 13, 2020

(87) PCT Pub. No.: WO2019/053256
PCT Pub. Date: Mar. 21, 2019

(65) Prior Publication Data
US 2020/0279791 A1     Sep. 3, 2020

Related U.S. Application Data

(60) Provisional application No. 62/558,887, filed on Sep. 15, 2017.

(51) Int. Cl.
| | |
|---|---|
| *H01L 23/373* | (2006.01) |
| *H01L 23/40* | (2006.01) |
| *H01L 25/07* | (2006.01) |
| *H01L 25/18* | (2006.01) |

(52) U.S. Cl.
CPC ...... *H01L 23/3735* (2013.01); *H01L 23/3733* (2013.01); *H01L 23/40* (2013.01); *H01L 25/072* (2013.01); *H01L 25/18* (2013.01)

(58) Field of Classification Search
CPC . H01L 23/3735; H01L 23/3733; H01L 23/40; H01L 25/072; H01L 25/18
See application file for complete search history.

(56) References Cited

U.S. PATENT DOCUMENTS

| | | |
|---|---|---|
| 3,295,089 A | 12/1966 | Moore |
| 3,656,946 A | 4/1972 | Inque |
| 4,290,080 A | 9/1981 | Hysell |
| 4,574,299 A | 3/1986 | Glascock, II |

(Continued)

FOREIGN PATENT DOCUMENTS

ES    2078171 A2    12/1995

OTHER PUBLICATIONS

International Search Report and Written Opinion dated Jan. 10, 2019 for corresponding International Patent Application No. PCT/EP2018/075059.

(Continued)

*Primary Examiner* — Tucker J Wright
(74) *Attorney, Agent, or Firm* — Tarolli, Sundheim, Covell & Tummino LLP

(57) ABSTRACT

A packaging method for power devices with optimized stacks of layers comprising different thermal expansion coefficients, the method including a stress relieving buffer technology designed to improve the thermal, electrical and mechanical contact between chips and electrodes. We disclose herein a buffer structure to provide stress relief between two layers of an electronic device, the buffer structure comprising: a plurality of discrete pillars closely packed together such that there is substantially no air gap between the plurality of conductive pillars, and wherein a height of each pillar is greater than a thickness of said pillar.

20 Claims, 37 Drawing Sheets

| | |
|---|---|
| 1 | chip |
| 2 | gate control pad |
| 10 | lower CPPGA buffer |
| 15 | upper CPPGA buffer |
| 20 | lower SP |
| 30 | upper SP |

(56) References Cited

U.S. PATENT DOCUMENTS

| | | | |
|---|---|---|---|
| 5,397,245 | A | 3/1995 | Roebuck |
| 6,397,450 | B1 | 6/2002 | Ozmat |
| 6,631,078 | B2 * | 10/2003 | Alcoe ............ H05K 3/303 |
| | | | 257/E23.087 |
| 6,703,640 | B1 | 3/2004 | Hembree |
| 6,903,457 | B2 | 6/2005 | Nakajima |
| 7,683,472 | B2 | 3/2010 | Popp |
| 8,368,207 | B2 | 2/2013 | Steger |
| 8,432,030 | B2 | 4/2013 | Malhan |
| 8,513,798 | B2 | 8/2013 | Otremba |
| 9,082,878 | B2 | 7/2015 | Otemba |
| 9,159,701 | B2 | 10/2015 | Hosseini |
| 9,589,922 | B2 | 3/2017 | Neugirg |
| 9,673,117 | B2 | 6/2017 | Maruyama |
| 9,691,674 | B2 | 6/2017 | Kodaira |
| 9,691,692 | B2 | 6/2017 | Miyakoshi |
| 9,691,732 | B2 | 6/2017 | Lin |
| 2014/0353818 | A1 | 12/2014 | Geitner |

OTHER PUBLICATIONS

Nakajima, Dai, et al. "High thermal dissipation transfer molded package for power modules." 2004 Proceedings. 54th Electronic Components and Technology Conference (IEEE Cat. No. 04CH37546). vol. 2. IEEE, 2004. DOI: 10.1109/ECTC.2004.1320367.

Hayashi, Kenichi, et al. "Improvement of fatigue life of solder joints by thickness control of solder with wire bump technique [power modules]." 52nd Electronic Components and Technology Conference 2002.(Cat. No. 02CH37345). IEEE, 2002. DOI: 10.1109/ECTC.2002.1008300.

Park, S. B., and Rahul Joshi. "Comparison of thermo-mechanical behavior of lead-free copper and tin-lead column grid array packages." Microelectronics Reliability 48.5 (2008): 763-772.

Grasso, Salvatore, Yoshio Sakka, and Giovanni Maizza. "Electric current activated/assisted sintering (ECAS): a review of patents 1906-2008." Science and Technology of Advanced Materials 10.5 (2009): 053001. DOI: 10.1088/1468-6996/10/5/053001.

Ozmat, Burhan, Bryan Leyda, and Burton Benson. "Thermal applications of open-cell metal foams." Materials and manufacturing processes 19.5 (2004): 839-862.

Evans, John, and Jillian Y. Evans. "Packaging factors affecting the fatigue life of power transistor die bonds." IEEE Transactions on Components, Packaging, and Manufacturing Technology: Part A 21.3 (1998): 459-468. DOI: 10.1109/95.725210.

M. Yajima et al. Reusable Thermal Conductive Sheet Containing Vertically Oriented Graphite Fillers "TC-S01A", Hitachi Chemical Technical Report No. 53 (Oct. 2009).

* cited by examiner

Figure 1
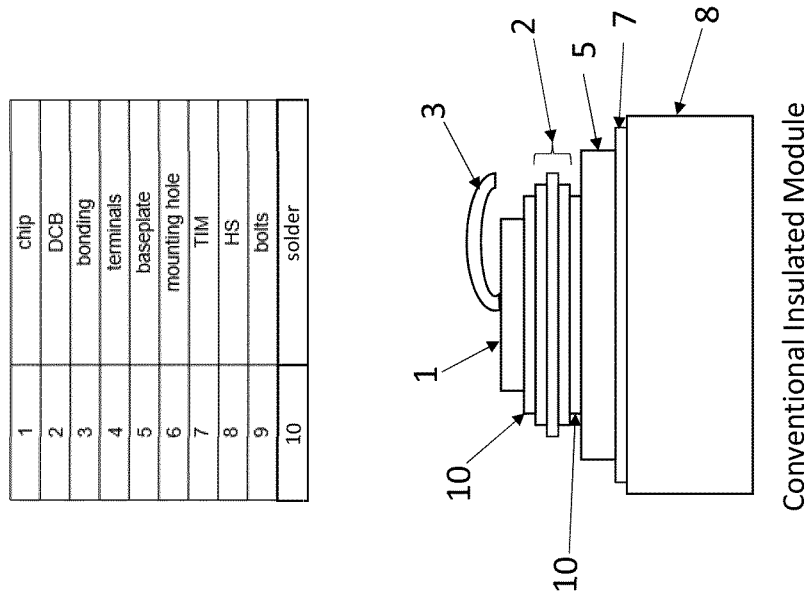
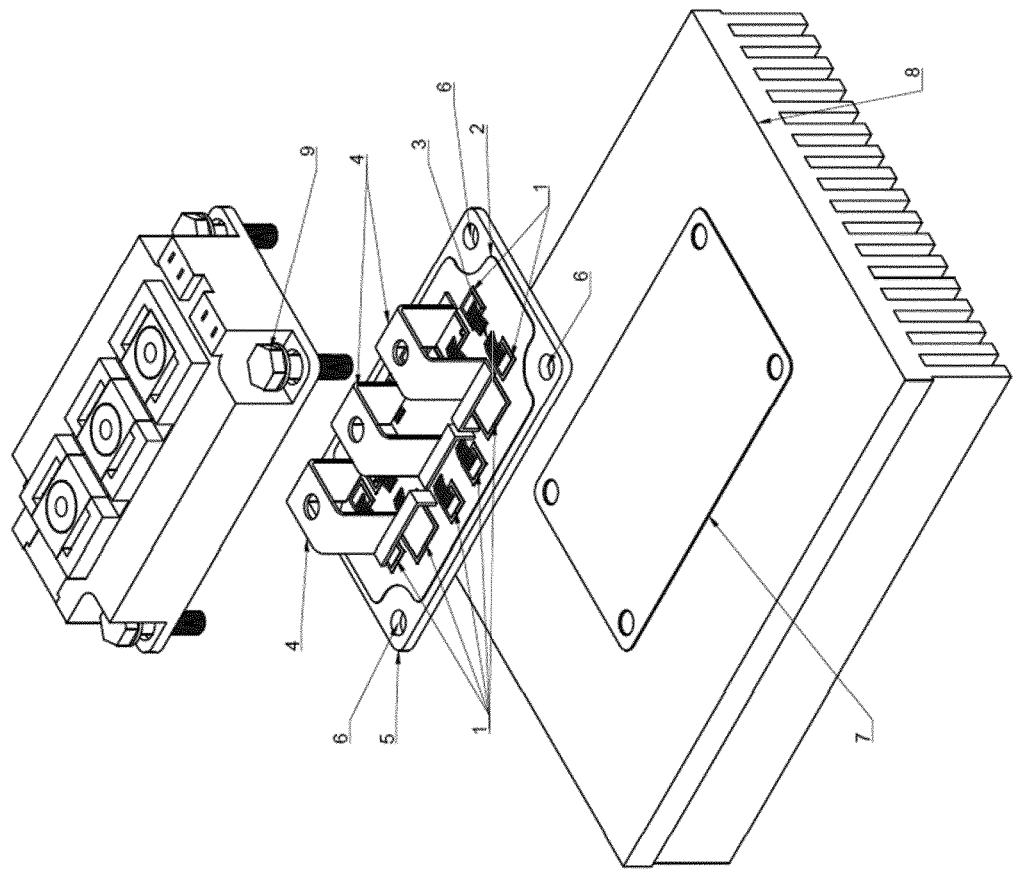

figure 2
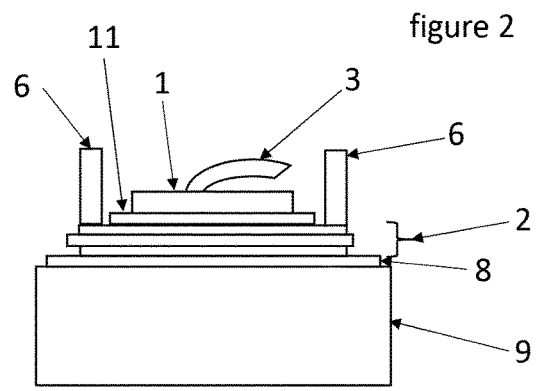
Base-less Insulated Module
| 1 | chip |
| 2 | DCB |
| 3 | bonding |
| 4 | cover |
| 5 | terminal |
| 6 | Pressure pins |
| 7 | Mounting hole |
| 8 | TIM |
| 9 | HS |
| 10 | bolt |
| 11 | solder |
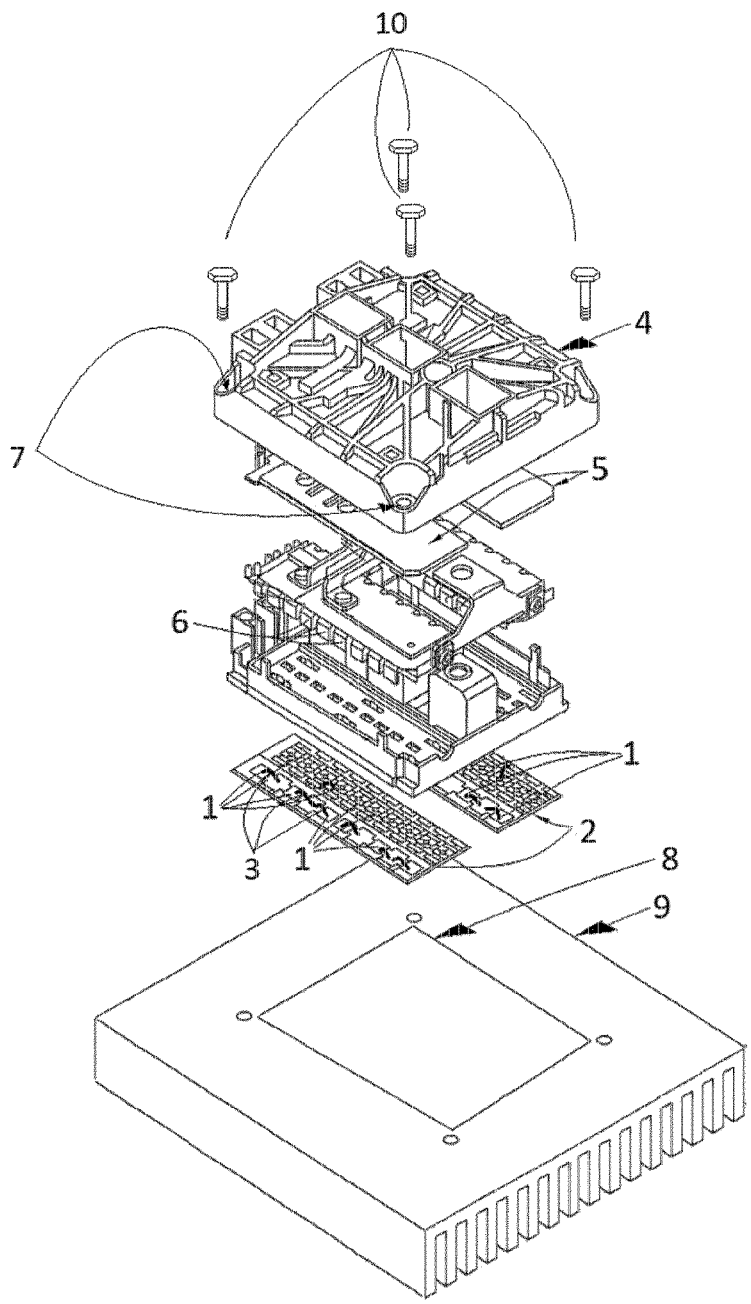

| 1 | chip |
| 2 | solder |
| 3 | bonding |
| 4 | Lead/spreader |
| 5 | Mold/resin |
| 6 | TIM |
| 7 | HS |

Uninsulated Discrete Device

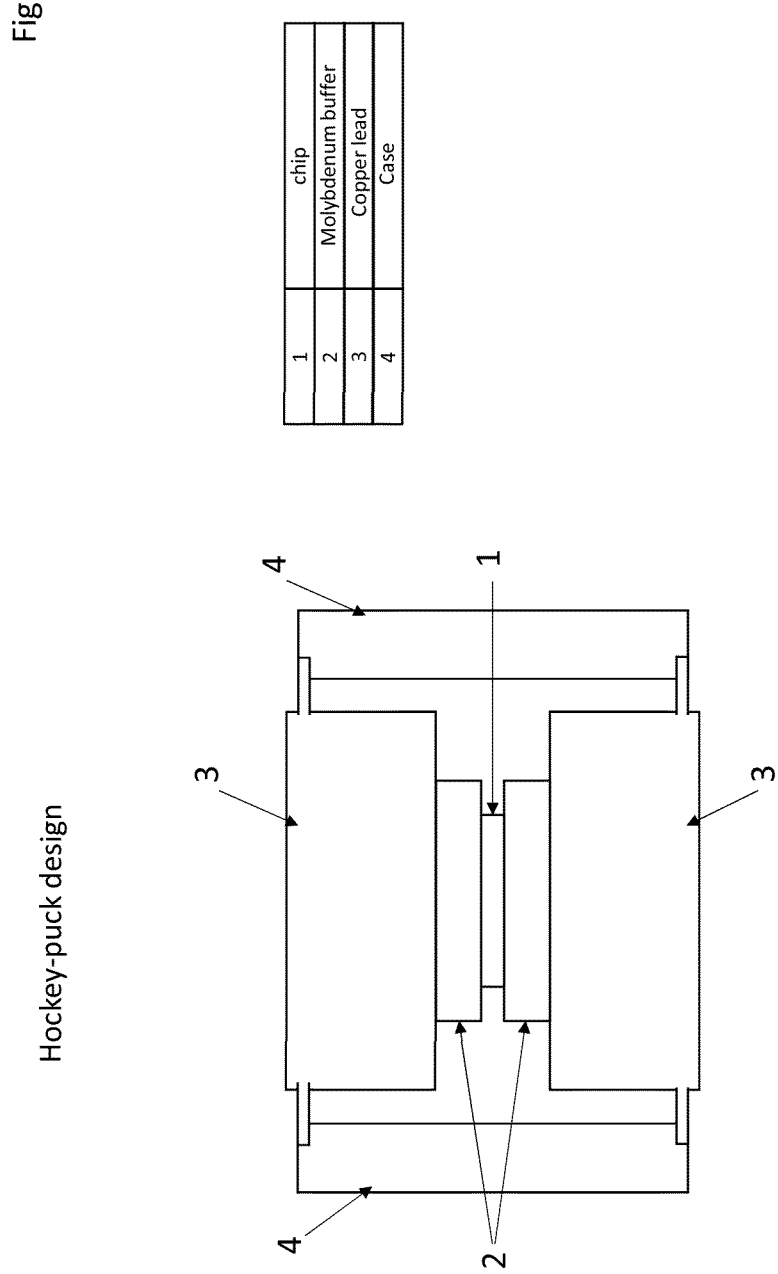

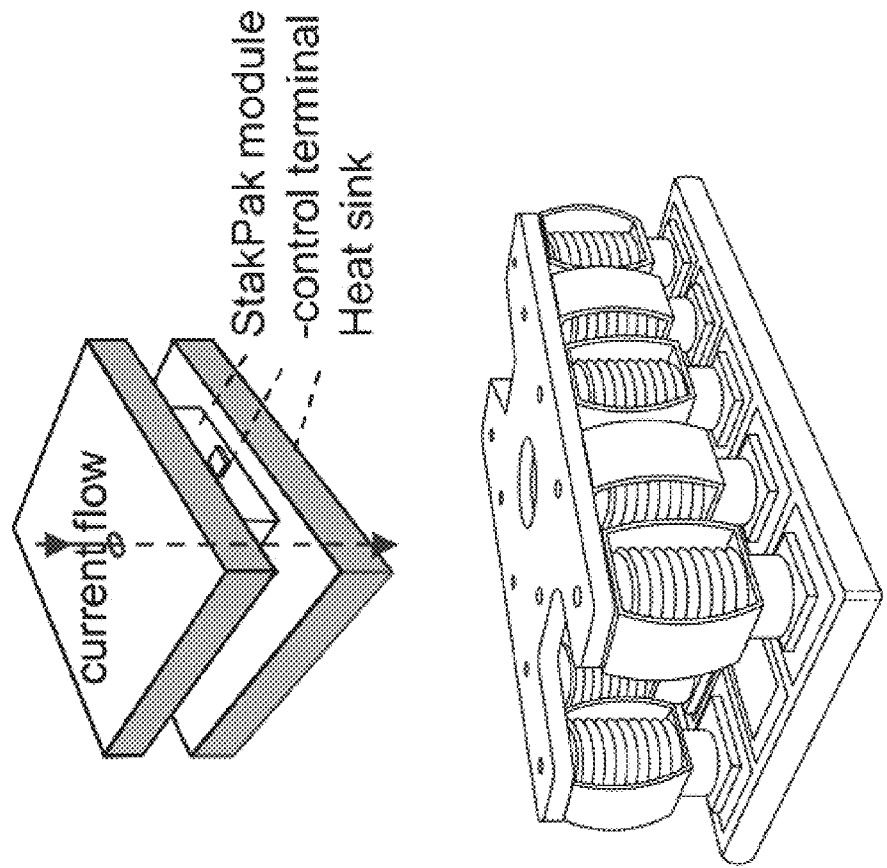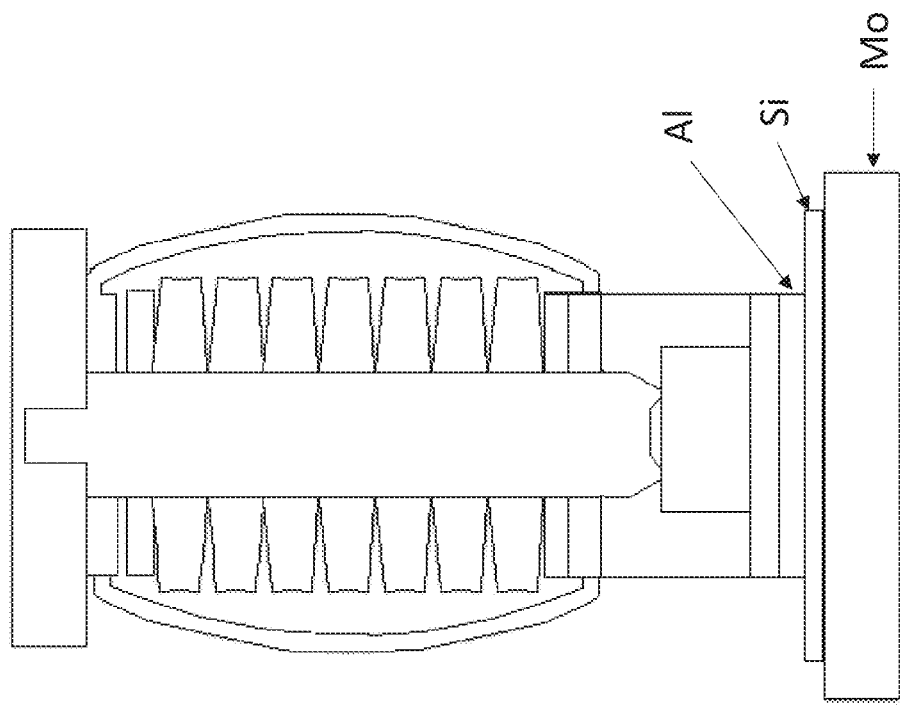

Open Foam Structure

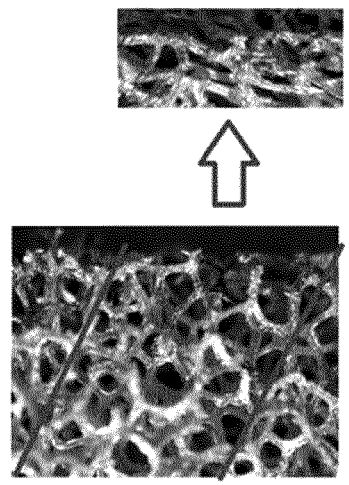
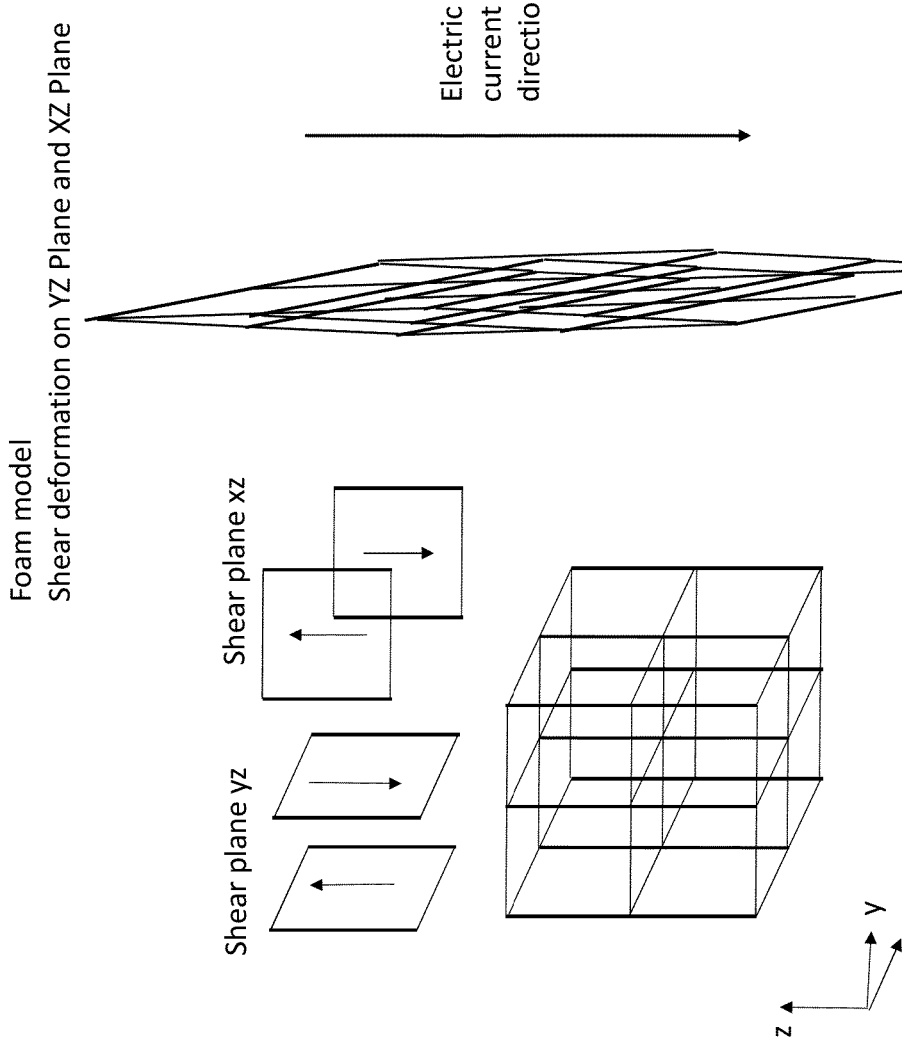
Figure 7e

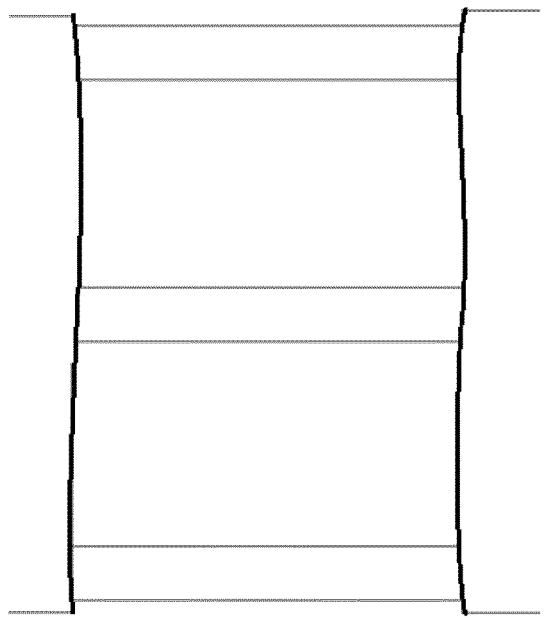
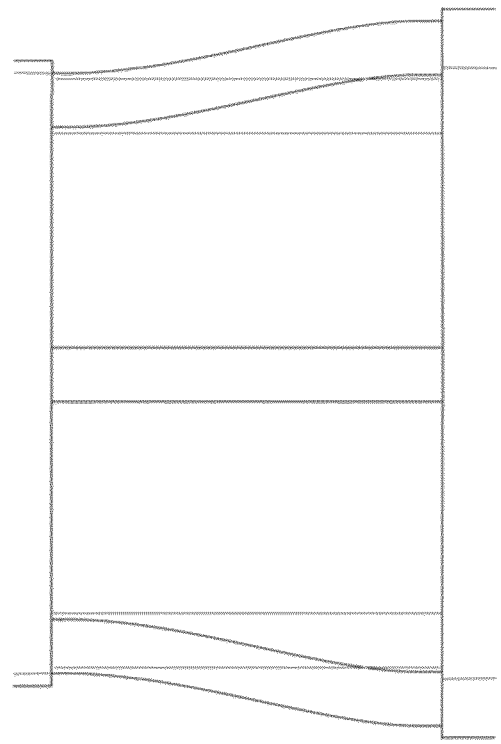
Figure 8b

| 1 | chip |
| 2 | gate control pad |
| 10 | lower CPPGA buffer |
| 15 | upper CPPGA buffer |
| 20 | lower SP |
| 30 | upper SP |

| | |
|---|---|
| 1 | chip |
| 2 | control gate pad |
| 10 | lower CPPGA buffer |
| 15 | upper CPPGA buffer |
| 20 | lower SP |
| 30 | upper SP |
| 41 | insulation element |
| 54 | cable |

| 1 | chip |
| 2 | CPPGA layer/buffer square |
| 3 | CPPGA layer/buffer hexagon |
| 10 | lower SP |

| | |
|---|---|
| 1 | chip |
| 2 | gate control pad |
| 10 | lower CPPGA Buffer |
| 15 | upper CPPGA Buffer |
| 30 | upper SP |
| 50 | substrate |
| 51 | routing |
| 52 | electronic devices |
| 55 | signal/control terminals |

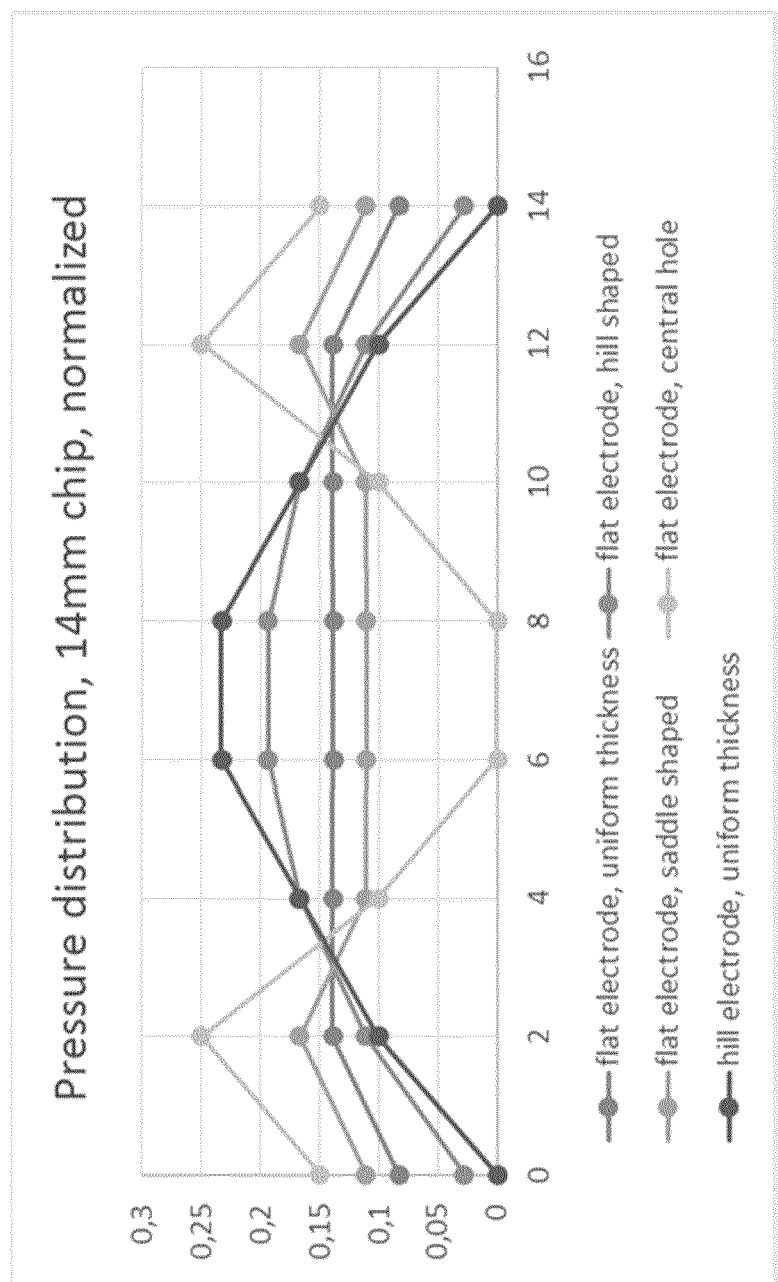

| 1 | chip |
| 10 | lower CPPGA layer/buffer |
| 11 | upper CPPGA layer/buffer |
| 12 | gate CPPGA layer/buffer |
| 20 | solder |
| 30 | diffusion bonding |

Diffusion bonded buffer chip ready block

| | |
|---|---|
| 1 | chip |
| 10 | lower CPPGA layer/buffer |
| 11 | upper CPPGA layer/buffer |
| 12 | gate CPPGA layer/buffer |
| 20 | solder |
| 30 | diffusion bonding |
| 50 | warped thin ceramic plate |
| 51 | lower CPPGA layer/buffer |
| 52 | upper CPPGA layer/buffer |

| 1 | chip |
| 3 | gate pad metalization |
| 10 | lower CPPGA layer |
| 15 | upper CPPGA layer |
| 16 | gate CPPGA layer |
| 20 | lower SP |
| 30 | upper SP |
| 50 | substrate |
| 55 | control terminal |
| 70 | seal |
| 90 | case |

| | |
|---|---|
| 1 | chip |
| 10 | lower CPPGA layer |
| 15 | upper CPPGA layer |
| 50 | filled region |
| 90 | case |

| 1 | chip |
| 10 | lower CPPGA buffer |
| 15 | upper CPPGA layer |
| 20 | lower SP |

| 1 | chip IGBT |
| 2 | control gate pad |
| 3 | chip DIODE |
| 12 | auxiliaryCPPGA buffer |
| 15 | upper CPPGA buffer |
| 17 | auxiliaryCPPGA buffer |
| 20 | lower SP low side |
| 21 | lower SP high side |
| 25 | power terminal |
| 26 | power terminal |
| 30 | upper SP low side |
| 31 | upper SP high side |
| 35 | power terminal |
| 40 | DCB |
| 50 | substrate |
| 51 | routing |
| 52 | electronic devices |
| 55 | control terminal |
| 90 | pressure enabling case |
| 91 | mounting hole |
| 100 | TIM |
| 110 | lower heatsink |

Insulated Discrete Device AUGMENTED PRESSURE

| 1 | low side chip |
| 2 | high side chip |
| 10 | low side lower CPPGA layer |
| 11 | low side upper CPPGA layer |
| 15 | high side lower CPPGA layer |
| 16 | high side upper CPPGA layer |
| 20 | lower SP |
| 25 | middle SP |
| 30 | upper SP |
| 50 | lower substrate |
| 55 | upper substrate |
| 100 | TIM |
| 110 | HS |

3D structure

| | |
|---|---|
| 1 | chip |
| 10 | lower CPPGA layer |
| 15 | upper CPPGA layer |
| 40 | lower resin insulation |
| 45 | upper resin insulation |
| 50 | filled region |
| 90 | resin/mold case |

Figure 20
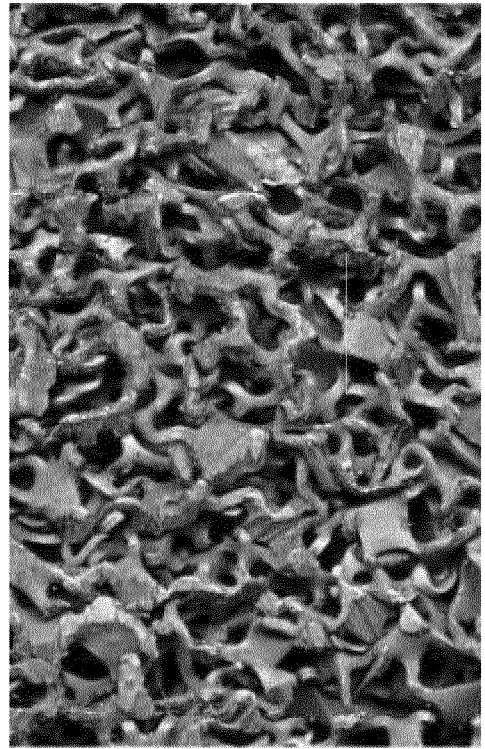
40% shear deformed foam heat sink
30ppi 8% dense Cu foam biaxially compressed to 35% density (from OZER research, can we use it??)
Note the much more regular configuration of the shear deformed structure compared to the compressed structure
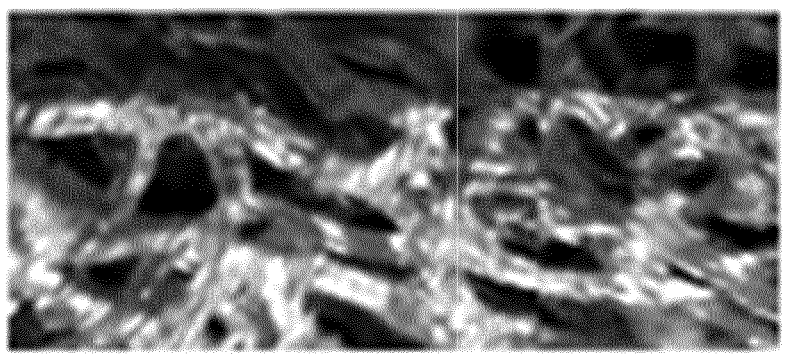
50ppi 7% dense Cu foam 2 side shear deformed to 40% density Figure 21
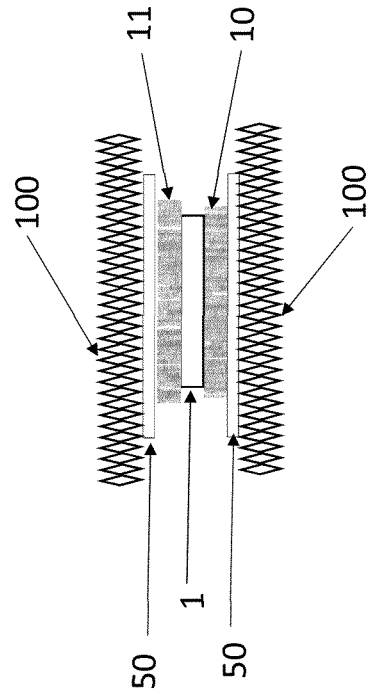
insulated CPPGA leads + shear def foam heat sink
| 1 | chip |
| 10 | lower CPPGA buffer |
| 11 | upper CPPGA buffer |
| 50 | substrate |
| 100 | 20-50% shear def foam HS/lead |
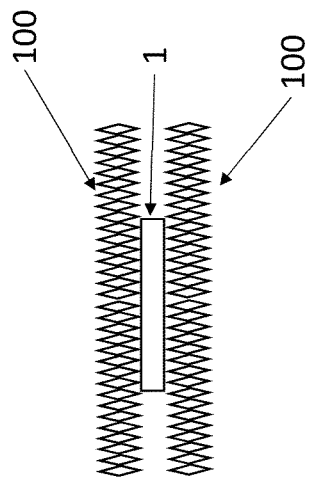
Uninsulated shear foam heat sink/lead direct cooling

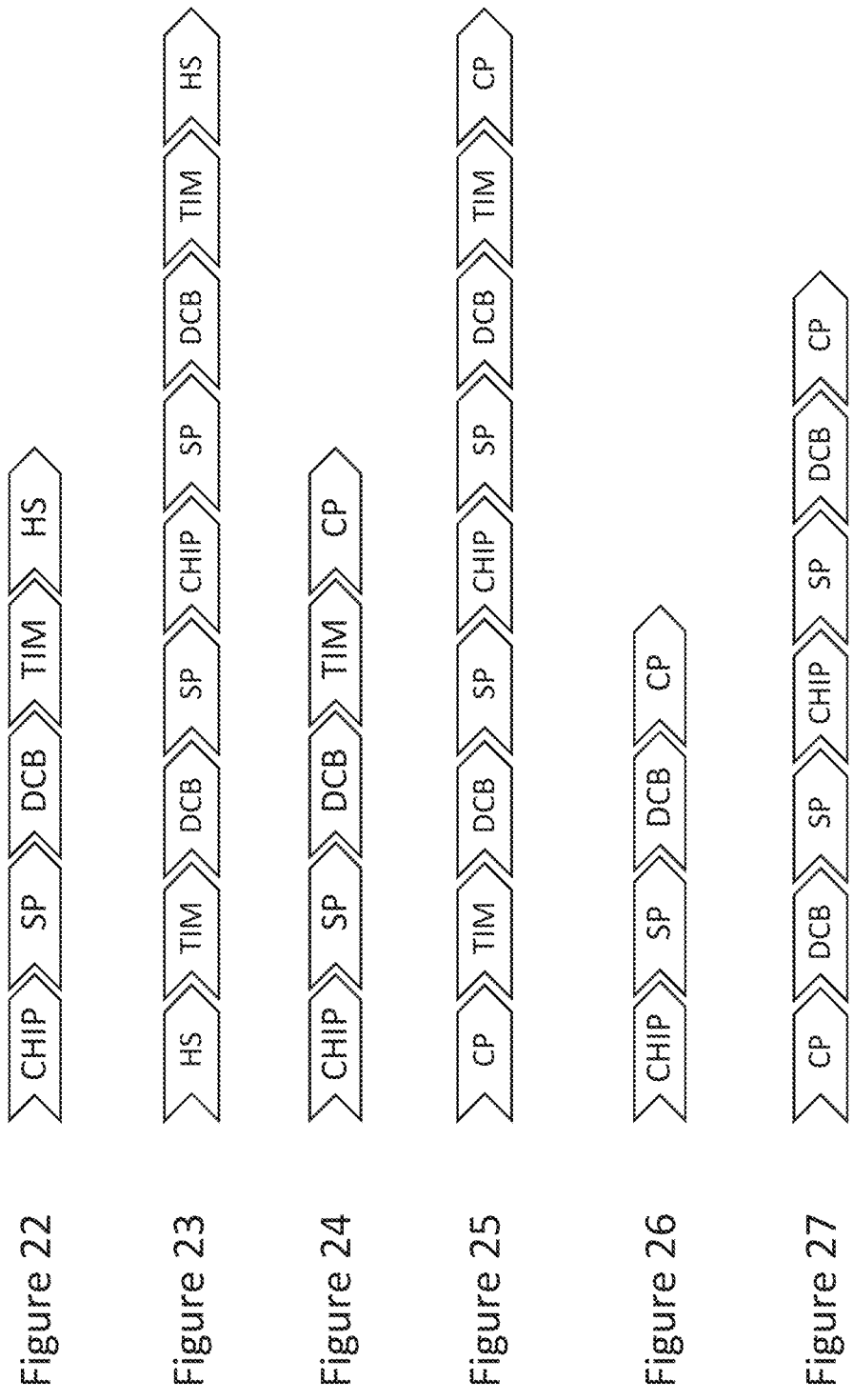

PACKAGING METHOD AND JOINT TECHNOLOGY FOR AN ELECTRONIC DEVICE

RELATED APPLICATIONS

The present application is a U.S. National Stage application under 35 USC 371 of PCT Application Serial No. PCT/EP2018/075059, filed on 17 Sep. 2018, which claims priority to U.S. Provisional Application No. 62/558,887, filed on 15 Sep. 2017; the entirety of both of which are incorporated herein by reference.

COPYRIGHT & LEGAL NOTICE

A portion of the disclosure of this patent document contains material which is subject to copyright protection. The Applicant has no objection to the facsimile reproduction by anyone of the patent document or the patent disclosure as it appears in the Patent and Trademark Office patent file or records, but otherwise reserves all copyright rights whatsoever. Further, no references to third party patents or articles made herein is to be construed as an admission that the present disclosure is not entitled to antedate such material by virtue of prior disclosure.

FIELD OF THE DISCLOSURE

This disclosure generically regards the packaging of a semiconductor chip and in particular an electronic device embedded in a package including a chip that can be applied to power modules, intelligent power devices, power discretes, high voltage disk cells, press packs or stacks and studs.

BACKGROUND OF THE DISCLOSURE

Introduction to State of the Art of Power Devices

Power modules are devices that embed in a single structure several semiconductors and circuits typically employed to perform complex functions. These are typically power semiconductors which manage a very high electric power flux compared to the control circuits that pilot them. Since power modules, intelligent power modules, power discretes, high voltage disk cells, press packs or stacks, studs and power devices in general handle higher and higher power density, the technical development of the packaging or "case", the structure that embeds the semiconductor device and contributes to the life and functionality of the enclosed electric and electronic device, is generally used to keep under control the semiconductor device's junction temperature and consequently the temperature of the active or passive devices embedded in the structure itself. These devices typically work at very different voltage levels making it necessary to employ an electric insulating structure between them and between the external environment.

Comment on the Typical Structure of a Power Module

An example of the typical structure of a power module is shown in FIG. 1, evidencing the typical structure including the die (1), which is connected to the copper tracks both directly through soldering and through wire or ribbon bonding (3). Copper tracks are joined (at the atomic level) to the insulating substrate: typically, alumina of various degrees of purity. This structure copper-alumina-copper is typically called DCB substrate (2) (Direct Copper Bonded). The DCB (2) substrate is soldered to a base plate (BP) (5) which includes the holes for the heat sink (HS) (8) assembly. The upper part is covered with an electrically insulating grease and all the structure is covered with a plastic cover, from which terminals and connections (4) are available. The module is assembled on a HS (8) using a thermal grease as thermal interface material (TIM)(7). TIM with thermal conductivity of 1 W/mK is typically employed in most devices currently available on the market. Due to the components mechanical stiffness, the peripheral position of the bolts and the structure's thermal deformation, it is not possible, in general, to keep a good contact pressure between BP (5) and the HS (8) and to compensate for this the TIM's (7) thickness is typically 100 µm.

All these sandwich layers between the junction and the HS, add a contribution to the total thermal resistance. Assuming for this example the typical dimensions of a 62Pak module (62 mm×104 mm) and 14 mm side square chip for the IGBT, thermal resistance $R_{th}$ between the junction and the HS is equal to:

$R_{th}$=0.245 K/W

The thermal resistance of the typical structure module is attributed approximately 36% to the DCB, 7% to the baseplate and 55% to the TIM. We believe that the typical structure has an inherent limitation because the DCB position limits the thermal flux cross-section and the device pressure uniformity on the HS is poor as the BP twists and bends at high temperatures thereby requiring a thick TIM layer.

Comment on the Structure of a Semikron "SKiiP" Power Module

FIG. 2 shows the Semikron "SKiiP" construction, described in the patent US008368207 from Semikron. The die (1) is soldered or Ag sintered to the DCB (2) and when it is assembled on the HS (9), an elastic structure (5) (distributed spring system) that presses the terminals (6) in a quasi-distributed way on specific pads on the DCB delivering a more uniform contact pressure on the plane. Optimal TIM (8) thickness for the "SKiiP" module is about 25 um. Thermal resistance $R_{th}$ between junction and HS is equal to:

$R_{th}$=0.177 K/W

The thermal resistance of the "SKiiP" module is about 30% better than the typical structure (including the BP). The thermal resistance of the "SKiiP" module is attributed approximately 50% to the DCB and 50% to the TIM. We believe that the "SKiiP" design has an inherent limitation regarding the thermal flux cross-section as there is no heat spreading mechanism before the DCB and TIM. We also believe that as a consequence of the limited mechanical stiffness of the DCB (there being no BP) there is a lack of uniformity in the device pressure on the HS thereby requiring a relatively thick TIM layer.

Current State of the Art Joint Technology

Standard manufacturing processes use solder or sintered silver to join the chip to the DCB and to join the DCB to the base plate (SP, a heat spreader, not a current spreader). The DCB role is tripled as it is generally critical to the electric insulation properties of the module, it matches the thermal expansion of the silicon chip while managing the difference in thermal expansion with the copper base plate (SP) and is used as an electric board using the upper copper layer as traces to connect the other semiconductor and elements composing the circuit enclosed in the packaging.

The chip is usually not connected directly to a thick metal heat spreader (SP), typically copper, as the difference in thermal expansion coefficient (TEC) at the joint creates very high mechanical stress that results in very low life and poor reliability, as cracks are easily formed and quickly spread along the joint. The maximum mechanical stress, which ignite the cracks and impacts reliability and life, is highly sensitive to the chip size as it is connected to the maximum deformation of the chip which is proportionate to chip size. A number of techniques have been developed to reduce the consequences of TEC differences between different materials as discussed below:

a) For small chip area size it is possible to directly solder the chip on the copper traces;

b) For medium chips on copper traces, silver sintering is used as an attachment, because sintered silver is softer than solder;

c) Larger chips can still be soldered or silver sintered on a copper trace but this has to be part of a DCB, the DCB is used to match the TEC of the chip to the thin copper layer which is then mechanically constrained by the underlying ceramic. Solder thickness and uniformity is generally critical together with enclosing material which is used to reduce periphery stress.

d) For even larger chips, like thyristor studs or disk cells, an interface material, usually molybdenum, joins the metalized plane to the metal electrodes. Molybdenum has a TEC very similar to the chip, reducing the high stress on the chip/molybdenum bond and transferring the stress within the joint to the tougher copper/molybdenum bond. Molybdenum however, is relatively stiff and as a result does not compensate well for height differences or defects on the interface planes which leads to pressure points and over-loading.

e) Other materials have been proposed like metal matrix composites or metallized ceramics. All these techniques conceptually introduce a stress relief buffer between the silicon chip and the metal electrode trying to match the silicon TEC while transferring the stressed joint to the tougher bond with the electrode. Since all the elements involved in the contact between the terminals and the chip are stiff, there are problems connected to stress concentrations connected to unevenness of the surfaces.

Significant Components of Thermal Resistance in a Power Device

In summary, the thermal resistance between the junction and the HS may be dominated by the following components which are all interconnected:

a) Heat flux cross-section in the layering;

b) TIM's thermal resistance (given by type of TIM and thickness);

c) DCB substrate's thermal resistance (given by type of insulator and thickness).

The objective of minimising thermal resistance between the junction and the HS is clear considering that silicon semiconductors stop working as a transistor at a temperature around 175° C. (this maximum temperature is dependent on the semiconductor employed) and with respect to reliability it is desirable that the operating temperature is significantly lower.

As we see above, technologies have been developed to reduce the TIM thickness (Semikron "SKiiP", by introducing a number of pressure points within the device to better distribute the mechanical pressure against the HS)) as well as technologies to improve the DCB performance using SiN for example.

The proposed technology of the current disclosure (i.e. Finar Buffer or CPPGA and its application) identified the following issues that are desirable to be resolved in order to provide significant performance improvements for power devices:

i. that the effective thermal flux cross-section from junction to HS is a significant element preventing the reduction of the junction to HS thermal resistance;

ii. that the interface between the power module and the HS (typically utilizing TIM) is a significant component preventing the reduction of the junction to HS thermal resistance; and/or iii. that the difficulty of creating a reliable joint between the semiconductor chip and metal is a significant element preventing the construction of the Optimal Layer Order;

iv. that the difficulty of creating a reliable joint between two materials with very different thermal expansion coefficients was a significant element limiting the reliability of any sandwich structure for power devices.

The proposed buffer or assembly/joining technology (i.e. CPPGA buffer) directly addresses these points and has better performance resulting from its construction that creates an improved thermal flux cross-section (junction to HS) and allows for an even thinner TIM while providing extremely high reliability, design freedom and flexibility and simplified construction and production process.

There exists a need for a packaging method for electronic power devices which minimizes the mechanical stress induced by temperature variations.

There exists a need for joint technologies minimizing the thermal resistance between chips and heat sinks.

There is a need for reliable joints between materials with different thermal expansion coefficients.

One or more of these or other needs may be overcome by embodiments of the present invention.

Significant Components of Reliability in a Power Device

Power density loss on present semiconductor dies can easily reach 200 W/cm$^2$. This astonishing power density has to be managed by the package by offering a very low thermal resistance to the cooling medium and the cooling capability is actually the limiting factor.

Packaging has to sustain high temperatures and a dramatic cyclical thermal load which include all time scales from less than millisecond to permanent, which translates in a very strong time varying thermal flux which imply also a strong time varying thermal gradient through the structure.

To handle these conditions, the package is typically composed of a number of layers which have very specific roles, including to handle the difference of thermal expansion coefficient (TEC) between different layers of the package itself, particularly the die-copper lead solder, the die-substrate solder (or soft sintered silver), the substrate-baseplate solder and the molybdenum buffer. This is a key role as reliability is basically dependent on the thermal wear-out of the interconnection material between these parts.

The basic solution to this issue is to introduce between layers with different TEC a buffer which reduces the local stress: for limited area interconnection it is possible to use soft solder of designed thickness to limit the plastic deformation connected with the different expansion of the two faces; for large area interconnection a buffer is introduced with TEC very similar to the most brittle material like molybdenum for the semiconductor interface.

Moreover, a number of other elements are introduced depending on the technology to enhance the control on thermal stress and plastic deformation of the joining material. Transfer mold technology generally relies on the solder thickness and softness and the compression and binding behaviour of the mold which is engineered to a specific TEC to minimize solder and bonding wires' strain and relative stress.

Power modules employ a substrate with a TEC intermediate between the semiconductor and the copper and solder thickness and softness to reduce the thermal stress (FIG. 1). For increased reliability an MMC baseplate is employed, typically aluminium silicon carbide (AlSiC), which can be designed to have a TEC very close to silicon but poorer thermal capability than Cu, while a higher performance but more brittle aluminium nitride (AlN substrate is employed to recover the thermal performances.

Press pack and hockey pucks (see FIG. 5) introduce a buffer material, typically molybdenum, between the semiconductor and the copper electrodes. The construction poses challenges in components flatness, roughness and dimensional uniformity as they are plugged together by pressure.

Tin based Solder (typical composition for lead free solders 95-97% Sn 3-5% Ag 0-1% Cu) is typically used for joining the different elements of a power devices between them. Solder thickness is the main element used to control TEC mismatch. Typically, a chip is joined to a DCB, using a solder thickness around 50 µm. Typically DCB is joined to the copper heat spreader using 200 µm to 300 µm solder thickness. To connect directly a chip (10 mm×10 mm) to a thick copper lead it is typically used close to 200 µm solder thickness. To make for a reliable joint even with such a thick solder layer, the device has to be embedded in a matrix, resin or mold, which further constrains the components limiting the mechanical stress on the solder (e.g. Mitsubishi patent U.S. Pat. No. 6,903,457 B2 and Infineon patent U.S. Pat. No. 8,513,798 B2). This structure is typically employed in uninsulated discrete devices as shown in FIG. 4.

Sintered silver has been introduced for joining a chip to a DCB, it usually has a thickness between 10 µm and 50 µm and effort is made to increase the density of the sintered silver to metal Ag density.

For large area chip, like large diodes or thyristors, a buffer material, typically molybdenum is introduced and joined to the die eventually just using dry pressure.

These are shown in the typical hockey puck configuration (Westinghouse) of FIG. 5, and mechanically more controlled devices employing press-pin structures FIG. 6.

Reliability is typically estimated using an accelerated test which performs a high temperature thermal cycle and observes the variation with the number of cycles of some device parameters like forward voltage, forward current, leakage current and thermal resistance setting a deviation from reference as fail test.

Basically all the power electronics material technology is revolving around the TEC matching and joining technology while maximizing thermal conductivity and minimizing parasitic inductance and capacitance.

To further develop the power density and the capability of power devices and to fully exploit the possibilities given by the high bandgap semiconductors like silicon carbide (SiC) and gallium nitride (GaN) devices it is desirable to address the TEC mismatch between adjacent materials and layers.

Direct connection of the chip to a metal electrode has been the object of constant development. Most uninsulated discrete power devices are produced using a thick solder layer between the chip and the electrode and embedding the system in a specialized mold. Reliability is typically very good as the solder thickness minimize the TEC mismatch strain and the mold surrounding the system contribute in the stress limitation especially at the outer border of the solder which greatly limit the crack initiation.

SmartPak (shown in FIG. 3) approached the solution proposing to attach the power dies (1) to copper electrode (4) using soft conductive resin (2) and embedding the system in a mold (6) which is employed also as insulating substrate (5) between the electrode and the heat sink. SmartPak reliability is generally acceptable as the self-conductive resin offers acceptable compliance, acceptable elongation and low stress. Moreover, the mold embedding the system relieves the stress from the resin border thus limiting the crack initiation process. However, it has been demonstrated that the SmartPak design suffers a few drawbacks from its design as the mold has poor thermal characteristics and the thickness used as substrate cannot be significantly reduced while holding a reliable insulation. Moreover, the exchange area is not optimal.

Mitsubishi transfer mold (shown in FIG. 3) introduces a very thick solder (2) between the chip (1) and the electrode (4), 180 µm solder thickness, and embed the system in a resin (6) having the CTE matched to the copper. This allows the sharing of the thermal induced stress of the CTE mismatch between the chip and the electrode also with the resin, especially at the border, thus limiting the crack initiation process. Moreover, a specialized resin is employed as substrate (5). There are a few drawbacks from this design: the adhesion of the resin to the copper electrode is not very good and typically grooves and dimples are stamped on the electrode surface. The resin has temperature limitations and the resin substrate has poor thermal properties compared to more traditional substrates.

Resin/mold adhesion on large copper spreader/baseplates is generally poor and unreliable and is an element limiting device size.

State of the Art in Conductive Foam Application in Power Electronics

A number of applications have been proposed using a conductive foam material with several scopes especially in high power devices like buffer material between the semiconductor and the metal leads or as small flexible contacts or as heat sinks.

Regarding high current applications, e.g. buffer between semiconductor and leads, these solutions typically suffer from poor thermal and electrical conductivity which limit their applications.

It has been known in the field that a strong monodirectional or one directional compression along the electric current direction, to reduce the buffer thickness is thought of having some effect on electric and thermal performances and a number of articles and recent patents consider the one or mono directional foam compression as the fundamental or conventional technique.

This approach has been already revealed to be ineffective in the work from Ozmat "Thermal Applications of Open Cell Metal Foams" B. Ozmat et al. Published in Materials and Manufacturing Processes, Special Edition, Vol. 19, No. 5, pp. 839-862, 2004 which regard heat sink but offer theoretical and experimental justification of the poor electric performance of mono-directional compression on conductive open cell foams.

Actually, foam cell deformation process is very counterintuitive and even Ozmat solution, which proposes a 2 directional lateral compression process to shape the foam in oval cavities, suffer from significant shape irregularity connected to the foam branch buckling which actually limit the performances of the heat sink.

The present proposal overcomes the limitations connected with one (mono) directional and two directional lateral compression processes.

Typically open cell foam structure has a complex shape similar to a dodecahedron which is shown in FIG. 7a. The deformation behavior of the foam is complex and counter-intuitive as wire buckling has a major impact on it. A useful representation for the sake of discussion is that of a squared reticulum which replicates the foam behavior.

The foam representation structure is shown in FIG. 7b. Given the foam structure with $$R_{wire} = \rho \frac{h}{A_{wire}}$$

The single wire resistance contribution $R_{wire}$ is given by
ρ: material resistivity
h: wire length (connected with cell size)
$A_{wire}$ wire cross-section (simplification due to joining point with other branches)

In the contact area there are available N wires. It is clear from the drawings that since N wires are available in parallel in the contact area, the foam z direction resistance $R_z$ is:

$$R_z = \frac{R_{wire}}{N}$$

It can be observed that ⅓ of the material contribute to the z direction conductivity while ⅔ of the material does not contribute. Roughly speaking the z direction resistance of an x % density foam is about 3/x % solid resistance (5% foam density offers 60 times larger resistance than solid). This is generally confirmed in a number of papers and foam datasheets and own measurements shown in FIG. 7f.

FIG. 7c shows a z uni-axially compressed foam.

It can be seen from the detail that the buckling of the wire in the z direction reduces the thickness of the compressed foam but does not reduce significantly the electric path along the z direction resulting in a very unfavorable result as:

$$R_{z1Dcom} = \frac{R_{wire}}{N}$$

Again ⅓ of the material contributes to the z direction conductivity while ⅔ of the material does not contribute. Roughly speaking z direction resistance of an x % density foam is about 3/x % solid resistance even after total compression in z direction (5% foam offers 60 times larger resistance than solid). The uniaxial compression does not improve significantly the electric and thermal conductivity of the foam.

This finding has been discussed and experimentally measured for example by Ozmat in his discussion about compression method of foam. 1D compression electric performances are shown in FIG. 7f.

Bi-directional compression in x,y direction allows a significant improvement on the mono-directional compression as more wires are forced together so the parallel paths available increase.

This is shown in FIG. 7d)

$$R_{z2Dcom} = \frac{R_{wire}}{N'}$$

Where N'>>N

Still only about ⅓ of the material contributes to the z direction conductivity.

Roughly speaking z direction resistance of a x % density foam compressed to Y % is about 3/Y % solid resistance even after total compression in z direction (5% foam compressed to close 100% offer at best 3 times larger resistance than solid)

SUMMARY OF THE DISCLOSURE

The disclosure provides a packaging method for power devices with optimized stacks of layers with different thermal expansion coefficients, including a stress relieving buffer technology designed to improve the thermal, electrical and mechanical contact between chips and electrodes and more in general between components with different thermal expansion coefficients eventually substituting some layers composed of solid material with a thicker version of the same stress relieving buffer.

In other words, the disclosure provides for handling thermal and/or electrical and/or insulating and/or mechanical contact between potentially completely different layers of a sandwich structure of power devices (with or without solder or other attach), more particularly, for handling stress induced by different thermal expansion coefficients between different layers of a power device.

The disclosure provides meaning to perform a solderless joint between the semiconductor metallization and a soft, elastic buffer allowing for a very flexible and greatly simplified assembly process.

The disclosure provides mechanical contact which offers elasticity and allows for large distributed pressure to be applied on the device to improve mechanical and thermal contact.

According to one aspect of the present disclosure, there is provided a buffer structure to provide stress relief between two layers having a different thermal expansion co-efficient in an electronic device, the buffer structure comprising: a plurality of discrete pillars closely packed together such that there is substantially no air gap between the plurality of conductive pillars, and wherein the height of each pillar is greater than the thickness of said pillar.

It will be appreciated that the buffer structure referred to here is generally the closely packed pin grid array (CPPGA) discussed in this document. The skilled person will understand that the applicant calls the buffer element as "Finar" which is a name of the element without relating to any technical feature associated with this particular name. The terms "buffer structure", "CPPGA", "CPPGA Buffer", "CPPGA Layer" and "Finar Buffer" can be used interchangeably in the present disclosure.

It will be appreciated that here the term "substantially no air gap" means the pillars are so closely packed with one another that there is almost no air gap between them. The skilled person would understand that there may be a small amount of air gap between them, but generally speaking the disclosure uses at least 70% fill factor between them so that there is almost no air gap between them. In a more preferable example, the fill factor is generally at least about 90% and more preferably over about 95% so that the pillars are very closely packed with one another.

In the known buffer devices, one block of material is generally used. In some known buffer devices, standard packing foams with a plurality of pores with an air gap are used. These arrangements are not advantageous because in a block element when compressed only ⅓ of the material is used for conduction. By contrast, the present disclosure proposes a buffer structure having a plurality of discrete pillars which are stacked together with no air gap between them. Advantageously, such a buffer structure provides substantially 100% conduction through the entire material. This is a significant improvement over the known buffer devices for power semiconductor devices.

It will be appreciated that here the electronic device generally refers to a power semiconductor device having a plurality of sandwiched layers and the buffer structure is generally provided between the layers, preferably having a different thermal expansion coefficient (TEC). Advantageously, the buffer structure (or Finar Buffer or CPPGA) improves joining performance and reliability between mismatched TEC materials or layers. In one example, we introduce a buffer material or structure engineered to provide an anisotropic behaviour that enables it to perform a number of tasks such as: a high flexibility on the plane direction (which is along the height of a pillar), to manage the joint between different materials or layers with different TECs. The buffer structure also ensures a very high thermal conductivity along the height or length to maximize thermal performance. Advantageously, the buffer structure ensures a very high electrical conductivity along the normal direction (or along the height of each pillar) to minimize electric resistance. Furthermore, the buffer structure provides a significant elasticity and compliance capability on the normal direction to perform as an efficient spring. Furthermore, the buffer structure can be very easily soldered or in some examples the buffer structure can be attached without using a solder material or a soldering process.

At least some (or all) of the pillars may be solid (or filled-in) pillars. At least some (or all) of the pillars may be electrically and thermally conductive.

The buffer structure may be placed between two layers such that the two layers are distant or spaced from one another by the height of each pillar. An electrical current may flow along the height of at least some of the pillars. In the buffer structure the height is always greater than the thickness or diameter of each pillar or pin.

A fill factor of at least some (or all) of the pillars each may be approximately 1. In one embodiment, to maximize thermal and electrical conductivity the fill factor has to be as close to unity as possible and is generally used for the engineering of the CPPGA buffer. At least some of the pillars may have a round shape having a single diameter. At least some of the pillars may have a hexagonal shape. In one example, using round pins of a single diameter the maximum fill factor can slightly exceed about 95%. In another example, using hexagonal pins, the fill factor can possibly reach about 100%. It will be appreciated that using pins of different diameter, the maximum fill factor can exceed 95%. The thin long pillar provides improved flexibility in the plane direction and extremely low structural stiffness even compared to a soft solder, not to mention to the semiconductor crystals and bulk metals.

The pillars may be packed together using an adhesive material. The adhesive material may be selected from a group comprising soft glue, resin, rubber, and volatile glue. The buffer structure may further comprise a solder material on both sides of the plurality of pillars. The buffer structure may further comprise an outer frame around the plurality of pillars.

The electrical connection between the pillars in a lateral direction along the thickness of each pillar may be less compared to the electrical connection in a vertical direction along the height of each pillar. In other words, the pillars or pins within the CPPGA structure may have a poor lateral connection between each other, so the CPPGA structure has a very low stiffness in the buffer plane normal (or perpendicular) to the pins. At the same time collectively, the pins offer a strong support in the pin direction (or along the height). The vertical support is exerted through pin or pillar buckling (or the bucking of the wire material in a foam).

The flexibility of the CPPGA may be determined by the ratio of the height and diameter of each pillar. The diameter of each pillar may be less than about 2 mm. Each pillar may comprise a conductive cable. Pillars or pins can be arbitrarily thin. In one example, copper wire diameter as small as 50 μm can be used. Alternatively, wire diameter of 100 μm may be used. Generally speaking, a CPPGA thickness as low as about 200 μm is feasible. In one embodiment, copper and silver-plated copper can be used as a buffer material.

Alternatively, each pillar may be made from a shear deformed foam. The shear deformed foam may comprise any one of a metallic foam, a ceramic foam, a metalized ceramic foam and a plastic foam. Advantageously, the CPPGA can be self-supporting and does not need glue or solder to keep the shape by choosing the foam cell size appropriately obtained.

The shear deformed foam may formed by applying a shear force along a height of the foam and by applying a tensile force along a thickness of the foam. The tensile component in the foam load allows the foam branches to bend and align along the direction before the buckling of the branches occurs. When this is applied the large majority of the foam cells collapse as a tighter and tighter oval until most of the structure is resembling a "kite" structure. Foam is particularly sensitive to direct tension load, so a method of fabrication is to apply a shear mechanical solicitation which is very effective in properly orienting the foam branches and form a nearly perfect CPPGA structure (in which the wires are aligned). Advantageously, the shear actually acts on the wire branches' joints by changing the angle and aligning the branches with almost no compressive load on the branches (or wire portions) themselves.

The shear deformed foam may have a substantially 'kite' structure. The shear deformed foam may be cut into a plurality of pieces along the height of the foam and each piece may form the buffer structure. The buffer structure may be made with an additive manufacturing technique.

At least some of the pillars may be filled with a material selected from resin, solder material, and unfilled protruded parts.

The buffer structure may be configured to use as an anisotropic interface material. The elastic modulus of each pillar may be smaller in a horizontal direction along the thickness compared to the elastic modulus in a vertical direction along the height of the pillar. Advantageously, the anisotropy is such that the material and/or structure offers a low elastic modulus on the horizontal direction, allowing for very different expansion and deformation at the joints of the two materials, that may eventually be bonded together, resulting in a greatly reduced mechanical stress at these bonds. It can be noted that introducing rounded corners in the joints and in the SP shape and DCB shape can significantly reduce the mechanical stress at the bonds. At the same-time it offers a complex elastic behaviour in the vertical direction as it can perform as an effective spring which exerts a high load, while having a low elastic modulus on the horizontal plane and this has the advantage of adapting much better to uneven contours thereby reducing load peaks (low spatial correlation of vertical displacement) and harmonizing the pressure between 2 stiff elements (chip and electrode or chip and substrate or substrate and heat sink). This also allows for easy compensation of large height differences and/or significant defects present in interface planes above and below the foam. Advantageously, this property eventually allows to spatially defining the local pressure between the electrode and the chip.

A semiconductor device may comprise: a semiconductor chip, a metal portion, and the buffer structure as discussed, and wherein the buffer structure may be placed between the semiconductor chip and the metal portion.

The buffer structure may comprise a bent ceramic structure dividing the buffer structure into a first portion and a second portion. Advantageously, the buffer structure or the CPPGA is very tolerant to mechanical unevenness, particularly roughness and flatness, allowing to relax the mechanical quality requirement of the components. Generally, the most challenging parts to achieve the required mechanical properties are ceramic based components. Surprisingly, CPPGA application to the ceramic substrate allows relaxing the required flatness according to the CPPGA thickness. This bent or warped structure allows employing very thin ceramic substrate which is actually not feasible (without the use of CPPGA) as they lack the mechanical toughness to resist the thermal induced stress.

A semiconductor device may comprise: an insulating layer, a metal portion, and the buffer structure as discussed above, wherein the buffer structure may be placed between the metal portion and the insulating layer. In this example, the insulating layer can be a direct copper bonding (DCB).

A semiconductor device may comprise: two pieces of metal or non-metal portions, which are different from one another; the buffer structure as discussed above, wherein the buffer structure may be placed between the two pieces of metal or non-metal portions to form an elastic and flexible joint.

The buffer structure may be configured to be used as a diffusion attachment to the metal or non-metal portions, and wherein the diffusion attachment may be formed using an electric current activated or assisted diffusion sintering technique. The CPPGA structure allows to apply easily a solderless, electric current activated or assisted diffusion attach. Further advantageously, every single pin under pressure offers a limited but clear contact with the other layer (chip/substrate metallization or bulk material) which are not affected from the actual roughness or planarity of the surface. This results in a very high number of contact and close to contact points which are strongly affected both by high local joule effect local heating, high current density possibly exceeding 10 kA/cm$^2$ locally, and high transient electric field. All elements which contribute to the electric current activated or assisted diffusion attach of the CPPGA structure with the nearby layer.

Generally speaking, electric current activated or assisted diffusion sintering is employed also to form insulating elements.

We disclose herein a semiconductor device comprising: a semiconductor chip, and the buffer structure as discussed above, wherein the buffer structure may be placed in contact with the semiconductor chip.

The semiconductor device may further comprise mold or resin or embedding material to embed the semiconductor device.

In one example, the mold or resin may include an insulating layer.

The insulation layer may be a specialised layer such as a direct copper bonding (DCB) element. In a further example, the specialised layer may be an active metal brazing (AMB), or an insulating resin sheet.

The buffer structure may comprise a filled region and an unfilled region directly, and wherein the filled region is configured to act as a heat spreader in the semiconductor device, and wherein the filled region comprises a solder material, soft resin or soft solder material.

A semiconductor device may comprise: a semiconductor chip, a metal portion, and the buffer structure as discussed above, wherein the buffer structure may be placed between the semiconductor chip and the metal portion, and wherein the buffer structure may be configured to be used as a spring. Advantageously, the pillars or pins can be vertically loaded as a buckling spring. Collectively they offer a significant spring capability which can transmit the mechanical load very evenly on the buffer structure covered surface. As a spring the CPPGA or the buffer structure can be designed to offer a given force-displacement curve and it can be designed to offer several millimeters of controlled displacement. This action is particularly interesting as it allows a very even and very high pressure distribution on the chip surface. This capability can be used to replace all the components of the hockey-puck structure as a thick CPPGA can replace all the elements between the chip and the electrodes Moreover, this property also allows for a consistent and reliable short circuit failure mode as when the chip fails for any reason the high local temperature and temperature gradient crack the silicon crystal and partially melt the CPPGA thus shortening the path between the two sides of the chip while the large part of the CPPGA unaffected from the catastrophic failure retain its spring behavior allowing for a consistent behavior.

According to a further aspect of the present disclosure, there is provided a use of a buffer structure, the buffer structure comprising a plurality of discrete pillars closely packed together such that there is substantially no air gap between the plurality of conductive pillars, and wherein a height of each pillar is greater than a thickness of said pillar, and wherein the use comprises providing stress relief between two materials having a different thermal expansion coefficient in a sandwiched structure of a power semiconductor device.

The use may comprise handling thermal and/or electrical and/or mechanical contact between different layers of the sandwiched structure.

The use may comprise providing an anisotropic material for joining two layers of the sandwiched structure.

The use may comprise providing a heat spreader between two layers of the sandwiched structure.

The use may comprise providing a spring mechanism between two layers of the sandwiched structure.

The use may comprise protecting a ceramic structure from a thermal induced stress when the buffer structure is provided on both sides of the ceramic structure.

The sandwiched structure may comprise a semiconductor chip, a metal electrode, an insulation layer, a thermal interface material and a heat sink, and wherein the use comprises providing the buffer structure between the semiconductor chip and the metal electrode, and between the insulation layer and the thermal insulation material.

According to a further aspect of the present disclosure, there is provided a method of manufacturing a buffer structure for providing stress relief between two materials having different thermal expansion coefficient, the method comprising: forming a plurality of discrete pillars closely packed together such that there is substantially no air gap between the plurality of conductive pillars, and wherein a height of each pillar is greater than a thickness of said pillar.

The method may further comprise packing together the pillars using an adhesive material. The adhesive material may be selected from a group comprising soft glue, resin, rubber, and volatile glue.

The method may further comprise providing a solder material on both sides of the plurality of pillars.

The method may further comprise providing an outer frame around the plurality of pillars.

The method may further comprise:
providing a plurality of discrete wires;
stacking the plurality of discrete wires such that the wires are substantially aligned with one another; and
cutting the plurality of wires along a cross-section or the wires or along a direction perpendicular to the longitudinal direction into a plurality of sections, wherein each section of the plurality of wires forms the buffer structure.

The method may further comprise providing a foam block having a plurality of pores and a plurality of wire portions surrounding the pores.

The method may further comprise applying a shear force along a height of the foam block to result in a tensile force so that the shear deformed cell structure of the foam has a substantially 'kite' structure. The method may further comprise applying a compression force to the substantially kite structure to flatten the kite structure. The wire portions of the kite structure may be very closely packed and aligned with one another.

The method may further comprise cutting the kite structure into a plurality of pieces along the height of the kite structure and each piece forms the CPPGA.

BRIEF DESCRIPTION OF THE DRAWINGS

The attached drawings represent, by way of example, different embodiments of the subject of the disclosure.

FIG. 1 shows a cross section of a typical known baseplate insulated power module;

FIG. 2 shows a cross section of the Semikron "SKiiP" power module (baseless insulated power module);

FIG. 5 is a drawing of known hockey puck press pack design;

FIG. 6 is a drawing of known press-pin design;

FIG. 7e shows a 2 planes shear deformed open cell foam and its behavior according to one embodiment of the present disclosure;

FIG. 8b shows the thermal deformation of a CPPGA between two largely mismatched TEC materials according to one embodiment of the present disclosure;

FIG. 9h shows a graph representing the normalized pressure distribution on a 14 mm IGBT chip for different electrode shapes and CPPGA shapes;

FIG. 20 shows the 2D shear deformed foam at 30-40% density as heat sink and comparison with 2D compression foam from Ozer research;

FIG. 21 shows the application of the 2d shear deformed foam as heat sink;

FIG. 22 shows an optimal layer order for single-sided cooling;

FIG. 23 shows an optimal layer order for double-sided cooling;

FIG. 24 shows an optimal layer order for single-sided liquid cooling;

FIG. 25 shows an optimal layer order for double-sided liquid cooling;

FIG. 26 shows an optimal layer order for a device in which coolant piping is imbedded in the case for single-sided cooling; and FIG. 27 shows an optimal layer order for a device in which coolant piping is imbedded in the case for double-sided cooling.

Those skilled in the art will appreciate that elements in the Figures are illustrated for simplicity and clarity and have not necessarily been drawn to scale. For example, dimensions may be exaggerated relative to other elements to help improve understanding of the disclosure and its embodiments. Furthermore, when the terms 'first', 'second', and the like are used herein, their use is intended for distinguishing between similar elements and not necessarily for describing a sequential or chronological order. Moreover, relative terms like 'front', 'back', 'top' and 'bottom', and the like in the Description and/or in the claims are not necessarily used for describing exclusive relative position. Those skilled in the art will therefore understand that such terms may be interchangeable with other terms, and that the embodiments described herein are capable of operating in other orientations than those explicitly illustrated or otherwise described.

DETAILED DESCRIPTION OF THE PREFERRED EMBODIMENT

Packaging Method—"FIMOLO"

The Finar Module Optimal Layer Order ("FIMOLO") using Finar Buffer between some or all of the thermally relevant layers of different materials composing the power device's structure (and even replacing some of the components of the module) is a central part of the Finar Module technology according to the present disclosure. This assertion is true for a sandwich structure which has a vertical dimension significantly smaller than the plane area (horizontal dimension), for any device that includes a chip, a conducting plate to spread the heat (spreader, SP), an electric insulator (e.g. DCB) and thermal interface material (TIM) between a power device and a HS.

Figure 16:
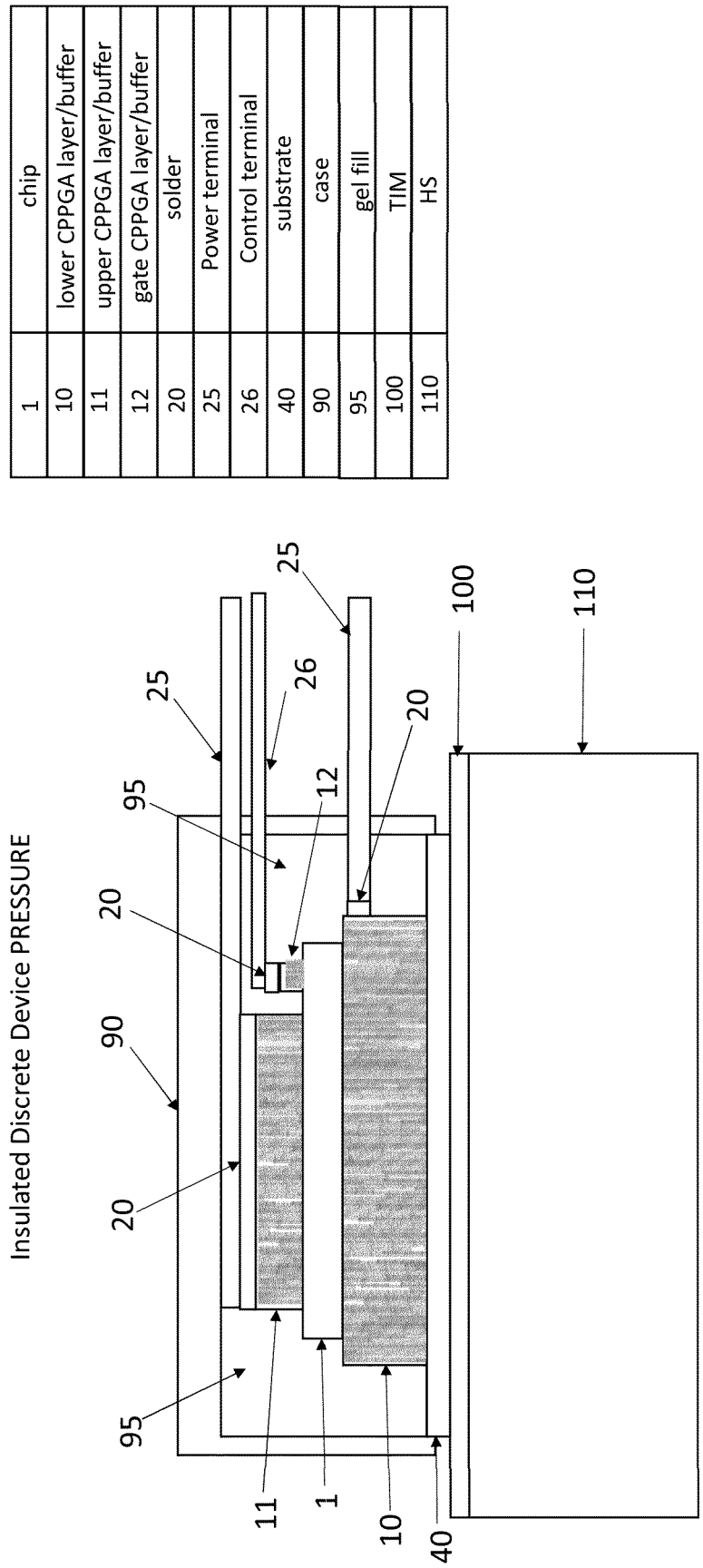
FIG. 16 shows an insulated discrete device using CPPGA as a spreader, as an elastic element and pressure distributor in which a hard cover presses the elements.
Figure 17:
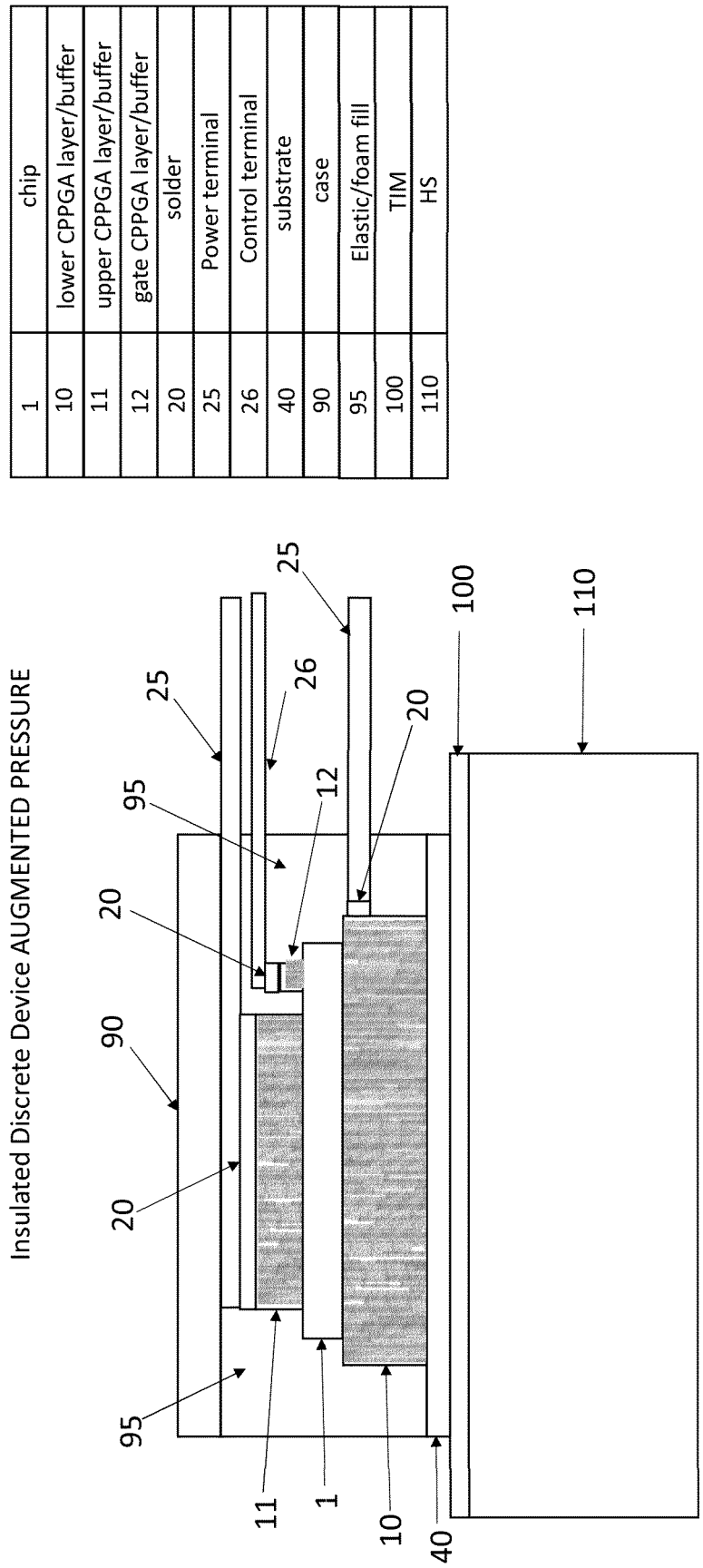
FIG. 17 shows an insulated discrete device using CPPGA as spreader, an elastic element and a pressure distributor. The system is embedded in a foamy mold as Enhanced FIMED Pressure. A hard cover provides the pressure vehicle. The structure is extremely tough.
Figure 18:
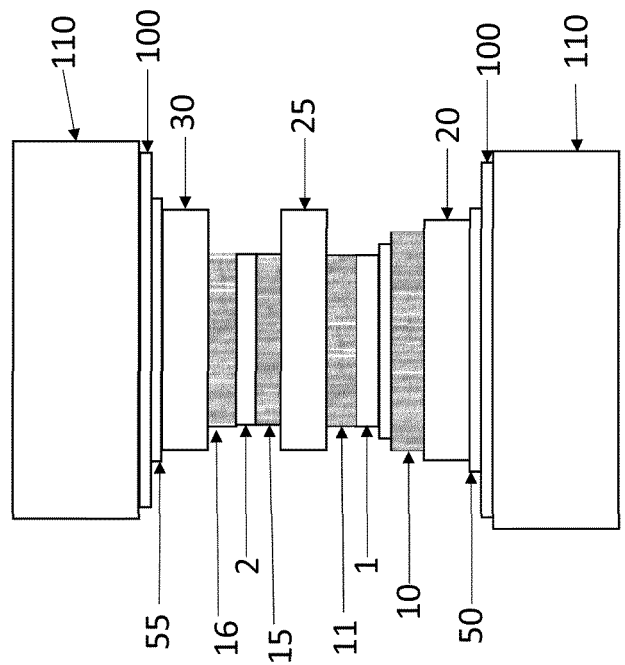
FIG. 18 shows a possible implementation for a 3D structure using a conductor between 2 level of semiconductors.
Figure 19:
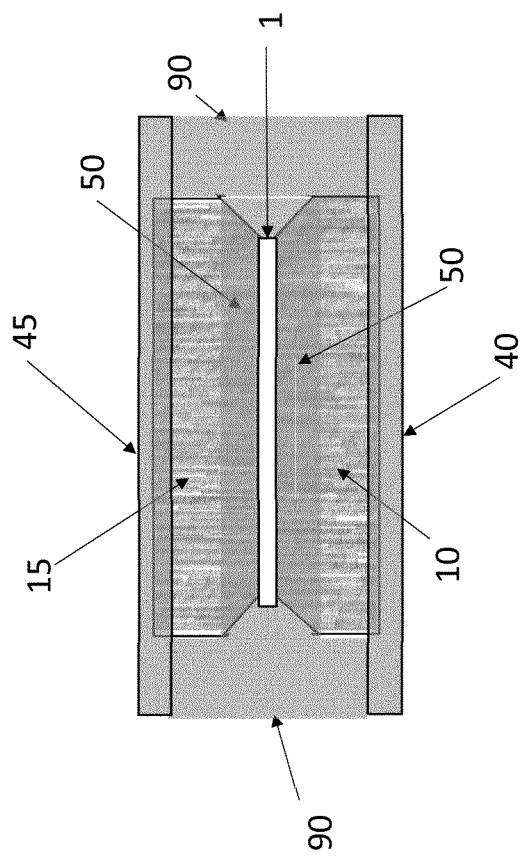
FIG. 19 shows the implementation for an insulated two sides cooling employing CPPGA only and a resin substrate.

Given a device in which the chip area is smaller than the device plane area, it can be proved that the most efficient way to transport heat for single sided cooling ("FIMOLO"), as shown in FIGS. 9g, 15, 16, 17 is according to the diagram shown in FIG. 22, while for double-sided cooling (HS are available on both sides of the device) it is possible to have a symmetrical structure around the chip and "FIMOLO", as shown in FIGS. 18, 19, becomes as shown in the diagram of FIG. 23.

It can be proved that this "FIMOLO" can result in significantly lower junction-to-case thermal resistance, than any other solution when the chip area is less than the thermal flux area (chip area divided by available area is less than 1).

For liquid cooling, it is possible to use two different structures:
a) a device which is assembled on the coolant piping (CP), which goes back to the previous case with "FIMOLO" for one sided cooling (see diagram shown in FIG. 24) and "FIMOLO" for double-sided cooling (see diagram shown in FIG. 25)
b) a device in which piping is imbedded in the case (TIM is substituted by a solder or other attach technology (e.g. silver sinter)), with "FIMOLO" for one side cooling (see diagram shown in FIG. 26) while "FIMOLO" for double-sided cooling, as shown in FIG. 21, is as shown in the diagram of FIG. 27.

Figure 15:
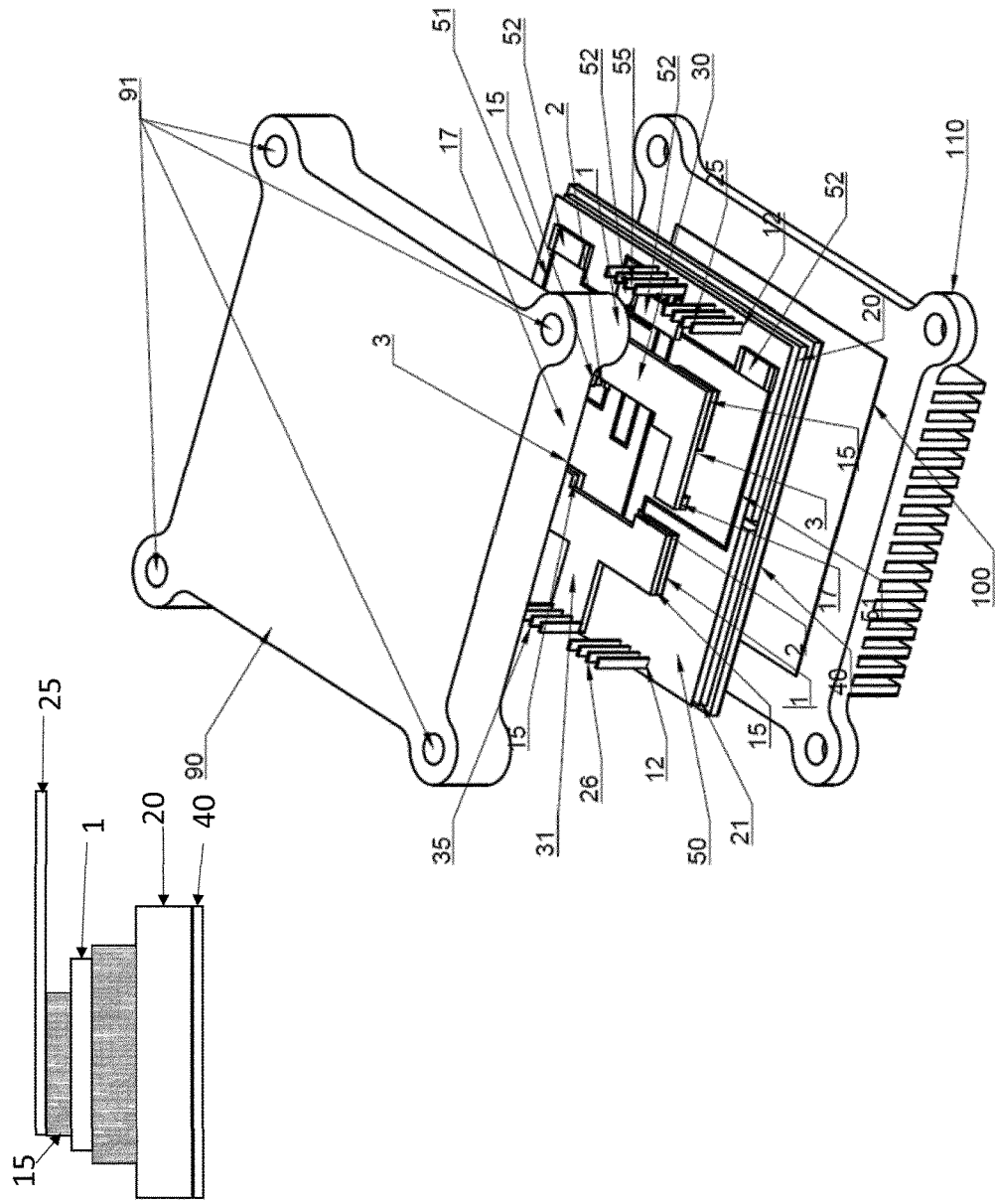
FIG. 15 shows a module employing FIMOLO, CPPGA, a solid spreader and CPPGA also on the top side removing bonding according to one embodiment.

Given a device in which the chip area is similar to the device plane area, as in discretes and high voltage devices, the SP is marginally useful as there is limited lateral space available to spread the thermal flux cross-section, but it aids the temperature distribution on the chip area. Of more consequence is the addition of the mechanical stiffness provided by the SP which provides enhanced distributed pressure on the HS ("FIMED Pressure") and significantly reduces the TIM thickness. Hence for one side cooling "FIMOLO", as shown in FIGS. 15, 17, is as shown in the flow diagram of FIG. 22 and "FIMOLO" for double-sided cooling, as shown in FIGS. 13, 18, 19 is as shown in the diagram of FIG. 23.

The very same consideration above applies for liquid cooling, also in the case of a device in which the chip area is similar to the device plane area and "FIMOLO" has been employed.

Joint Technology Using Anisotropic Interface Material

The proposed CPPGA buffer or buffer structure (which is also termed as "Finar Buffer") is a novel and advantageous joint technology to improve the thermal, electrical and mechanical contact between the mismatched TEC materials like between the chip and the electrodes or chip and DCB or electrodes and DCB.

We use an anisotropic interface material and/or structure which is placed as a thin or thick layer between the semiconductor and the electrode as a joint stress-relief buffer ("CPPGA") or between the semiconductor and the substrate as a joint stress-relief buffer or between the semiconductor and the substrate as a joint stress-relief element and heat spreader as shown in FIGS. 9a to 9g. (between two mismatched TEC materials in general) The anisotropic interface material and/or structure which is placed as a thin or thick layer can also be used to exert controlled and well-defined mechanical pressure directly on the chip and throughout the device, after the device has been compressed, providing further benefits of elasticity and pressure (where the pillars in the CPPGA buffer are acting as a spring) ("FIMED Pressure"), see FIGS. 13, 15, 16, 17, 18, 19.

The anisotropy is such that the material and/or structure offers a low elastic modulus on the horizontal direction, allowing for very different expansion and deformation at the joints of the two materials, that may eventually be bonded together, resulting in a greatly reduced mechanical stress at these bonds. It can be noted that introducing rounded corners in the joints and in the SP shape and DCB shape can significantly reduce the mechanical stress at the bonds (see FIG. 9d). At the same-time it offers a complex elastic behavior in the vertical direction as it can perform as an effective spring which exerts a high load, while having a low elastic modulus on the horizontal plane and this has the advantage of adapting much better to uneven contours thereby reducing load peaks (low spatial correlation of vertical displacement) and harmonizing the pressure between 2 stiff elements (chip and electrode or chip and substrate or substrate and heat sink). This also allows for easy compensation of large height differences and/or significant defects present in interface planes above and below the foam as shown in FIG. 8b. This property eventually allows to spatially define the local pressure between the electrode and the chip.

Joint Stress Relief Buffer—Using Anisotropic Interface Material—"Finar Buffer" or Closely Packed Pin Grid Array or Buffer Structure To improve joining performance and reliability between mismatched TEC materials, we introduce a buffer material engineered to provide anisotropic behaviour that enables it to perform any one or more of a number of tasks:
 a) High flexibility on the plane direction, to manage the join between different materials with different TECs;
 b) Very high thermal conductivity along the normal direction to maximize thermal performance;
 c) Very high electrical conductivity along the normal direction to minimize electric resistance;
 d) Significant elasticity and compliance capability on the normal direction to perform as an efficient spring;
 e) Very poor spatial correlation in the plane to accommodate for poor surface roughness and planarity; and/or
 f) Easily soldered This Buffer is an electrically and thermally conductive material that has an ideal structure that can be described as a Closely Packed Pin Grid Array (CPPGA). (where the width of the pillar is small relative to its height)

Figure 8A:
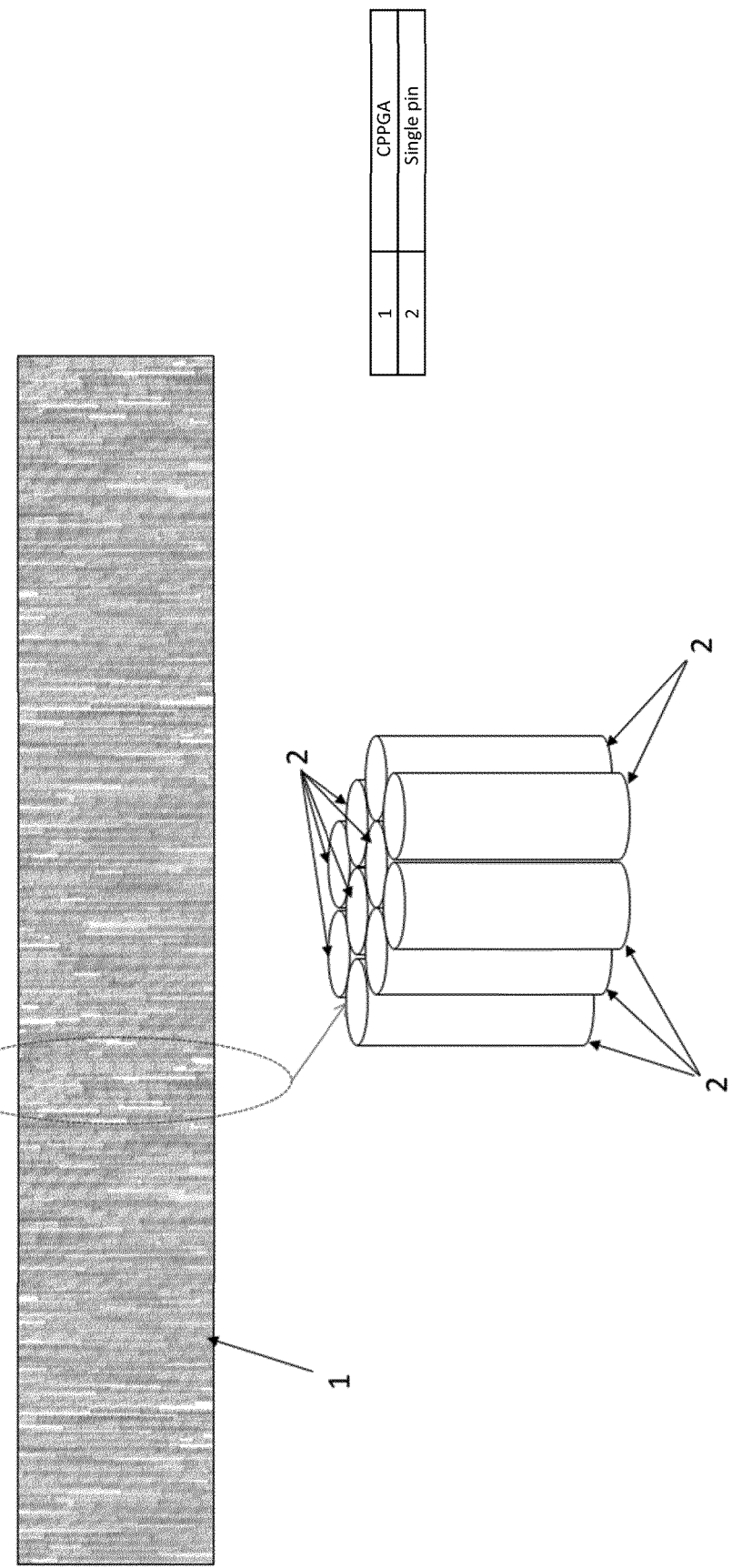
FIG. 8a shows a concept structure of a closely packed pin grid array (CPPGA) according to one embodiment of the present disclosure.

FIG. 8a shows the structure of CPPGA, FIG. 8b shows its deformation behaviour and the roughness compliancy. Pin Grid Array (PGA) structures are known and the outstanding reliability of the structure due to the compliancy of the pins. PGA structures are the reference in the electronic industry to connect the CPU to the motherboard virtually on every computer in the last 20 years. The limitation of PGA structure is the very low fill factor of the pin area to the available area which is generally around 5%.

The present disclosure addresses this issue in PGA. To maximize thermal and electrical conductivity the fill factor has to be as close to unity as possible and is a key element of the engineering of the CPPGA buffer. Using round pins of a single diameter the maximum fill factor can slightly exceed 95%. It will be appreciated that using hexagonal pins the fill factor can possibly reach 100%, pin flexibility may be reduced due to hexagonal corners. Using pins of different diameter, the maximum fill factor can exceed 95%. The thin long pillar provides improved flexibility in the plane direction and extremely low structural stiffness even compared to soft solder, not to mention to the semiconductor crystals and bulk metals.

The pins within the CPPGA structure may have very poor lateral connection between each other, hence the CPPGA structure has a very low stiffness in the buffer (or horizontal) plane normal to the pins. At the same time collectively, the pins offer a strong support in the pin direction. The vertical support is exerted through pin buckling.

As a reference, CPPGA buffer flexibility is enhanced by the height/diameter ratio. Pins can be arbitrarily thin. Copper wire diameter as small as 50 μm are commercially available as a commodity. Wire diameter 100 μm are typically found in commercial cables. A CPPGA thickness as low as 200 μm is feasible. The present CPPGA buffer has been realized using copper and silver-plated copper as a buffer material. It has been developed using a number of techniques:

CPPGA-p: (FIG. 8a, 8c) in one example, a number of short pins have been placed together to form a CPPGA. To keep the structure in shape it is possible to use several techniques. In one example, the pins are glued together using a very soft glue material or resin or a volatile glue material which will leave the structure during curing. After this, one or both the sides of the CPPGA has been soldered using a very limited solder quantity. Finally, an outer frame is placed to keep the shape.

In a further example, CPPGA-p (FIG. 8a, 8c) structure can be formed by extrusion of properly designed wires embedded in a matrix material using the same techniques used by cable producers which allow forming a long extruded structure which can be cut to meet a given thickness. The embedding matrix can be a resin or a rubber or another embedding element, eventually solder. The embedding matrix can be designed to be lost during high temperature exposition like during a soldering operation. It can be designed to include conductive powder of different mesh or whiskers to reach a very high fill factor together with the wires and further improve electric and thermal conductance. It can be designed to be partially substituted by other embedding elements like soft or hard solder. It can be designed to offer high adhesion to other materials used to join the different layers (see FIG. 9e, 19).

In an alternative example, CPPGA-f: (see FIG. 8a, 7e) a structure very similar to the CPPGA is derived from proper deformation of an open cell metallic foam. Choosing the foam cell size properly the CPPGA obtained is self-supporting and does not need glue or solder to keep the shape.

Foam deformation to obtain a structure close to CPPGA is complex and is not simply compression based. Due to the particular way the foam structure collapse under compression load, uniaxial and multi axial compression does not improve the conduction properties of the foam along the pin axis linearly.

To obtain near solid performances it is desirable to align the open cell foam structure along the preferred direction to obtain a structure resembling a CPPGA. The shear force introduces a strong tensile component in the foam load which allows the foam branches to bend and align along the direction before the buckling of the branches occurs. When this is applied the large majority of the foam cells collapse as a tighter and tighter kite structure until most of the structure is resembling a CPPGA structure.

Foam is particularly sensitive to direct tension load, a method of fabrication is to apply a shear mechanical solicitation or force which is very effective in properly orienting the foam branches and form a nearly perfect CPPGA structure (FIG. 7e). The shear actually acts on the branches' joints changing the angle and aligning the branches with little or no compressive load on the branches themselves.

Eventually to the shear load it can be added a direct tensile load to further improve the cell reshaping. The diameter to height ratio is basically established from foam pores per inch and the branches' diameter. Multiple layers are possible, it introduces a loose lateral connection which marginally increases the CPPGA stiffness. Copper foam is a commodity available worldwide in a wide range of options matching well the CPPGA for power electronic applications e.g. branches diameter 10-100 um, branches length 100 um-3 mm.

Actually, a typical copper foam branch has a 50 μm diameter and cell size is available from fractions of a millimetre to several millimetres which is well suited for the CPPGA application.

Turning to the FIG. 7e and FIG. 8a again, in one example, CPPGAs a formed from a foam, for example, a metallic foam. The foam is shown in a 3D cubic form in FIG. 7e. The form includes a plurality of air-filled holes or pores which are spaced apart from one another by wire materials (solid lines in the cube structure). The 3D structure is arranged in x-y-z axes. As can be seen in FIG. 7e, shear force is applied in the xz axes and yz axes. The shear force coupled with the tensile element make the foam structure very narrow (the "kite" like structure in the middle in FIG. 7e). As a result, the wire materials are aligned or closely packed to one another. Preferably, more shear force is applied to make the foam structure even further narrow and long, so that the wire materials are all closely packed with one another. After that the long foam material (derived from applying the shear force which is the kite like structure in FIG. 7e) is cut into slices in the vertical direction and one of the slices is shown in FIG. 8a. It can be seen in FIG. 8a, in one slice, there are a number of wire materials closely packed with one another. In FIG. 8a, the wire material from FIG. 7e is termed as a pin or a pillar. Each pin has a larger height compared to the diameter of each pin. The CPPGA structure of FIG. 8a is used as a buffer between two surfaces of an electronic device structure. The direction of current flow through the CPPGA is along the direction of the height of the wire materials or cables.

FIG. 7e) shows the deformation effect induced by the present technique which prevents buckling of the wires and proceed to a reorientation of the structure as shown in figure. In this case we use 100% of foam material to contribute to the z direction conductivity obtaining nearly solid conductivity.

$$R_{zSH} = \frac{R_{wire}}{N''}$$

Where N" accounts for all wires filling the cross-section area. Roughly speaking z direction resistance of a x % density foam compressed to Y % is about 1/Y % solid resistance even after total compression in z direction (5% foam deformed to 50% offer approximately 2 times the resistance than solid, deformed close 100% offer approximately the same resistance than solid).

This technique allows improving dramatically the regularity of the oval shape of the deformed foam offering a shape much closer to the optimum identified in Ozmat works previously discussed "Thermal Applications of Open Cell Metal Foams" B. Ozmat et al. Published in Materials and Manufacturing Processes, Special Edition, Vol. 19, No. 5, pp. 839-862, 2004 which is useful to improve heat sink performance beyond the performance already obtained with 2D compression.

An electrical resistivity test is prepared to compare electrical resistance of bars composed of treated copper foam for different deformation conditions. Results are shown in FIG. 7f. Shear deformed foam have been successfully formed up to 80% density. The foam produced CPPGA offer elasticity connected to cell pore size and branch width. Wire produced CPPGA offer >95% density and similar electrical conductivity.

It is possible to consider other techniques to prepare a CPPGA structure, eventually using additive manufacturing. The limits are given by the clearance between the wires to form pins which are actually individual elements. At present the clearance that may be needed to form independent elements is not irrelevant compared to the pin dimension lowering the additive manufactured CPPGA to something close to 50% fill factor. It can be considered to directly form a pin heat sink.

The CPPGA can be applied using solder or silver sinter or brazing or with a dry contact or diffusion attach. When additive attach material is used it is desirable to keep the fillet dimension under control as the height to thickness ratio of the pillar is relevant for the flexibility and softness of the buffer.

As the pillars or wires or wire materials (from FIG. 7e) are very close together solder fillet can be very small and there is no issue in solder bridging the pillars. This solder distribution provides a good defence to the ratcheting forces resulting from pillar bending during thermal cycles.

Figure 9A:
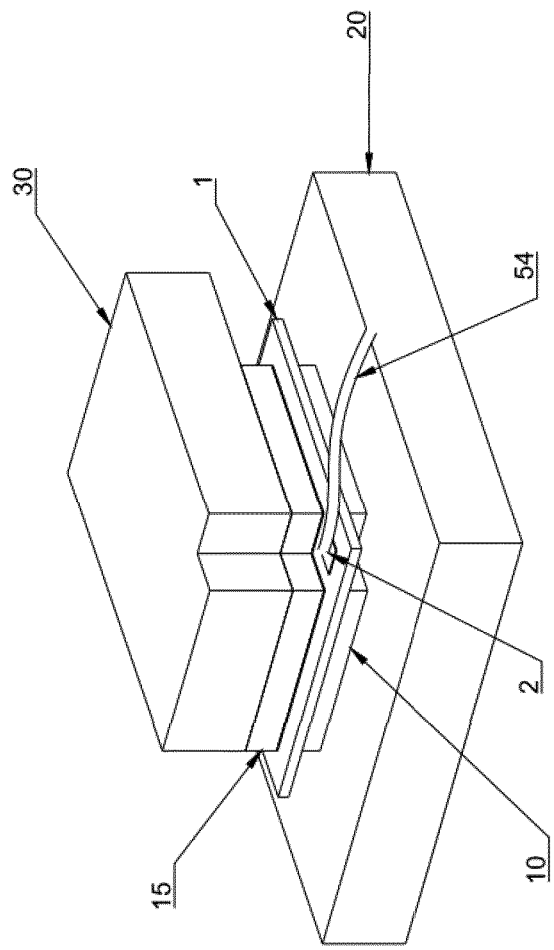
FIG. 9a shows a proposed module technology for a generic power device demonstrating CPPGA application around the chip and a first method of wiring on the chip's control gate pad (traditional bonding) according to one embodiment of the present disclosure.
Figure 9B:
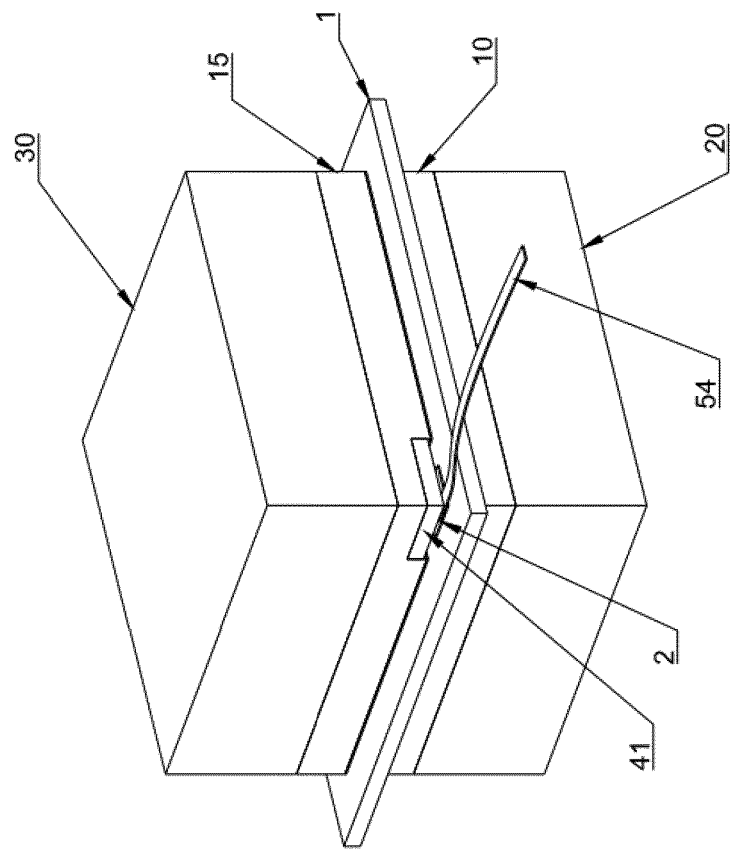
FIG. 9b shows a proposed module technology for a generic power device demonstrating CPPGA application around the chip and a second method of wiring on the chip's control gate pad.
Figure 9C:
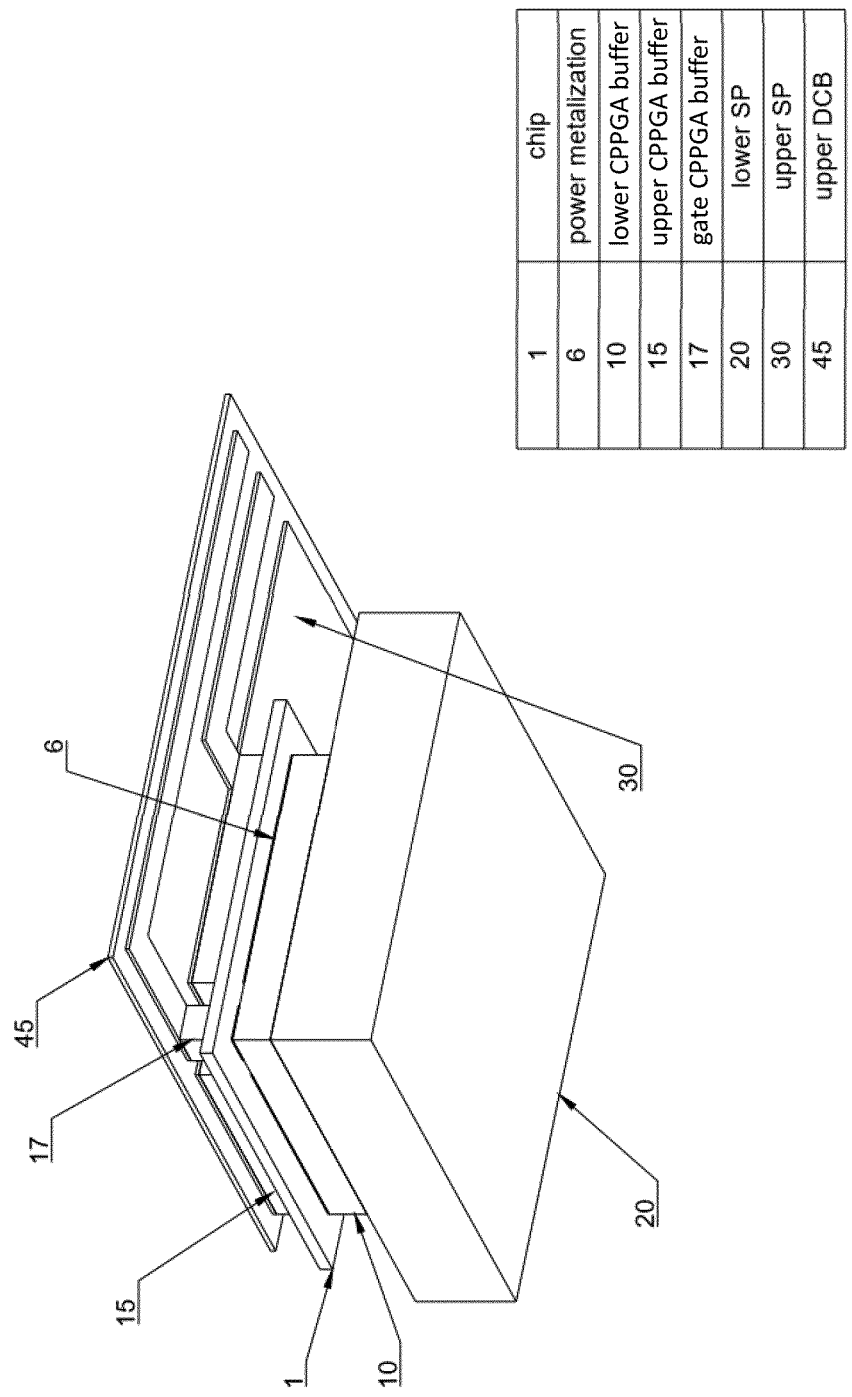
FIG. 9c shows a proposed module technology for a generic power device demonstrating "CPPGA Buffer" application around the chip and a third method of wiring on the chip's control gate pad according to one embodiment of the present disclosure.

The application of the present CPPGA structure as joint buffer between any materials with different TECs is straightforward, involving any one or more of the following:

It allows the direct application of bulky electrodes to the semiconductor, eventually on both sides and on the gate or other control ports (FIG. 9a, 9b, 9c).

Figure 9D:
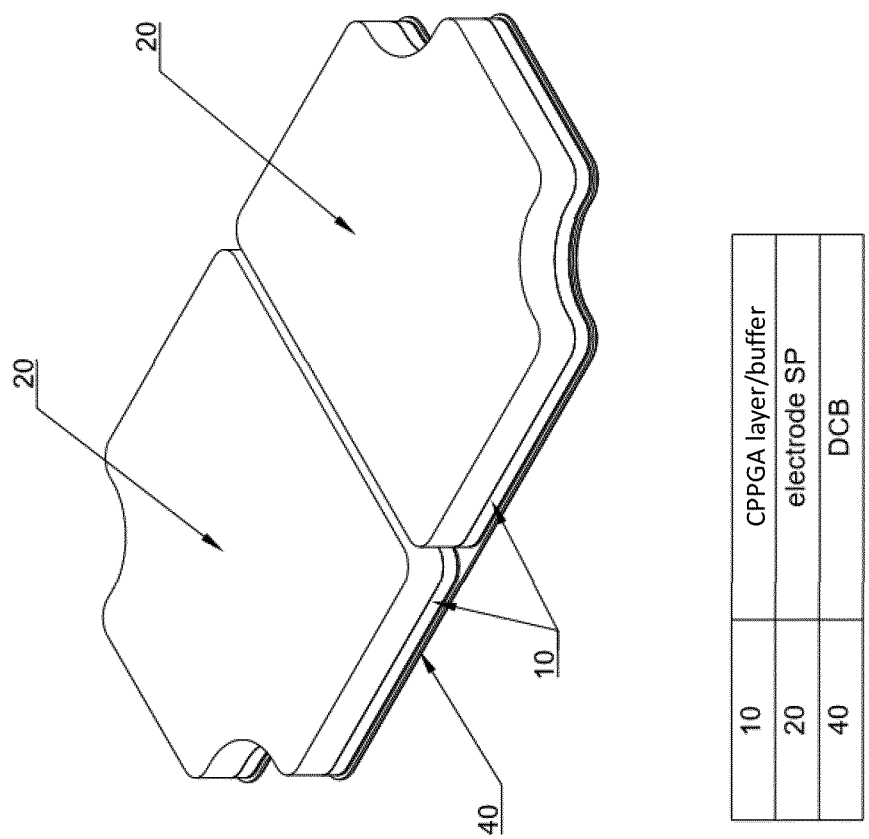
FIG. 9d shows a proposed module technology for a generic power device demonstrating CPPGA application between two mismatched TEC materials like a DCB and a spreader according to one embodiment of the present disclosure.

It allows the connection between large, thick copper heat spreader (and electrode) to large substrates (FIG. 9d).

It allows high and very uniform pressure to be applied to the semiconductor (FIG. 9h).

It allows the reduction of the thermal deformation induced by thermal gradient in the package structure.

Figure 9E:
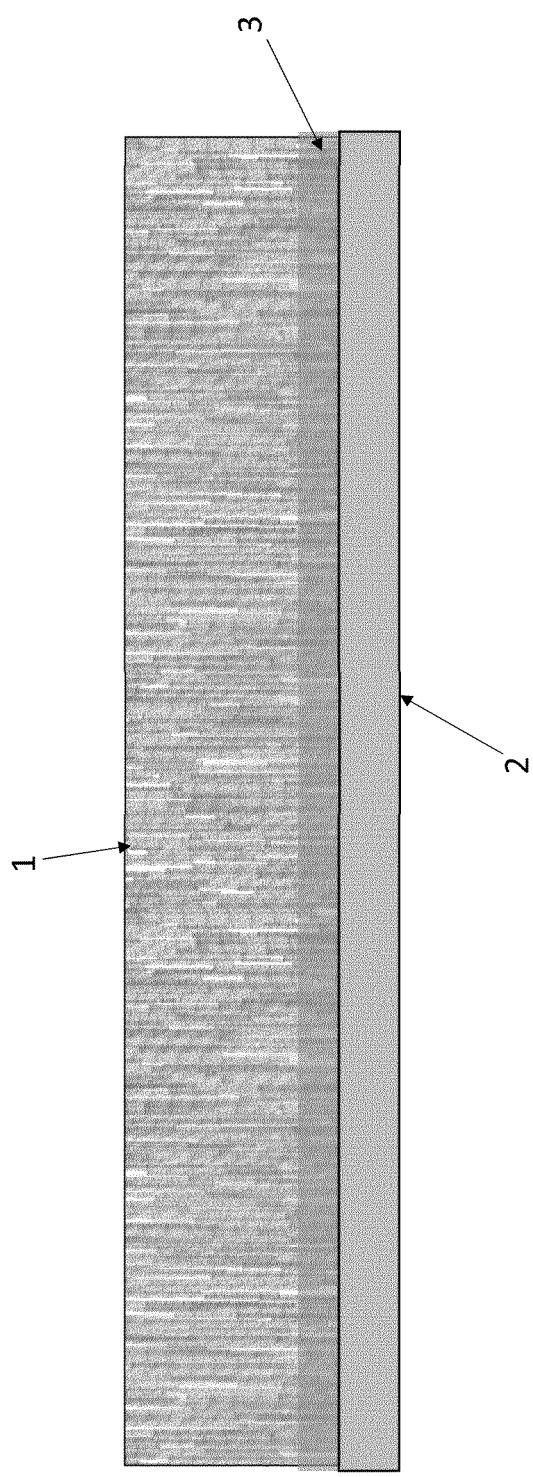
FIG. 9e shows a proposed module technology for CPPGA application to resin/mold gripping according to one embodiment of the present disclosure.

It allows very high gripping on mold and resin (FIG. 9e, 19)

It allows very large area mismatched TEC material join, eventually employing grooved structures or a number of patches (FIG. 9d, FIG. 13)

It allows removing bonding from power devices pads. (see FIG. 9b, 9c, 12, 16, 17, 18, 19)

It allows symmetrical thermal path around the semiconductor and double-sided cooling FIG. 13, 18,19, 21

It allows straightforward 3D topologies (see FIG. 18) It allows elastic and virtually stress-free signal termination It allows elastic and virtually stress-free power leads It allows for a low inductance structure (FIG. 18). It allows for the introduction of anti-inductance power lines; and/or It allows structures for current sharing to minimize self-induction on series connected package.

Joint Stress Relief Buffer CPPGA-Metal Diffusion Attach

Figure 10:
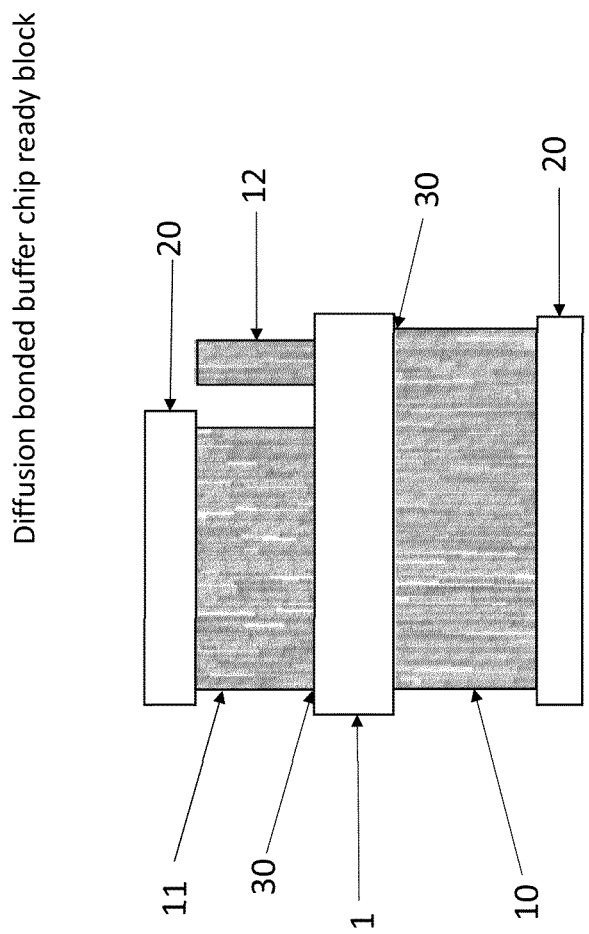
FIG. 10 shows the electric assisted diffusion sintering between CPPGA and metallization/metal/(insulator) according to one embodiment.

Advantageously, the CPPGA structure allows to apply a solderless, electric current activated or assisted diffusion attach easily as shown in FIG. 10.

Electric current activated or assisted diffusion sintering is a very attractive technique as powders can be sintered quickly and with very high quality as the Joule effect typically heats mainly the material to be sintered and the high current (typically 1 kA/cm$^2$) greatly enhances the removal of pollutant and oxides from the powder joints. (U.S. Pat. No. 3,656,946A) and allows for low temperature sintering at approximately 200 C.

Surface attachment application typically requires a very high quality of the facing materials including extreme surface smoothness and demanding cleaning processes.

The CPPGA structure greatly releases these constraints as every single pin under pressure offers a limited but clear contact with the other layer (chip/substrate metallization or bulk material) poorly affected from the actual roughness or planarity of the surface. This results in a very high number of contact and close to contact points which are strongly affected both by high local joule effect local heating, high current density possibly exceeding 10 kA/cm² locally, and high transient electric field. All elements which contribute to the electric current activated or assisted diffusion attach of the CPPGA structure with the nearby layer.

Electric current activated or assisted diffusion sintering is employed also to form insulating elements, typically. It is desirable to investigate if it is possible to proceed to a process similar to copper-alumina diffusion bonding using electric assistance. Using a CPPGA structure the demand for high mechanical precision in the contact is greatly relaxed.

In one example, experimentally the present dry attachment has been proofed using a copper CPPGA structure on both sides of a power diode. The attachment has been successful on both sides of the diode. The diode presents two different metallization, one side is silver (Ag) coated solder ready while the other side is aluminum silicon (AlSi) coated bonding ready. Both have been attached to a copper CPPGA structure using approximately 1 kA/cm² average current. Local temperature has not been measured, diode temperature was between 150° C. and 200° C. Structure was compressed in excess of 100 MPa.

Application of high current can result in local heating exceeding 100000 K/s during the first current transient producing copper and silicon parts melting and an extremely large temperature gradient induced strain in the silicon which crack open eventually in multiple points. Notably the parts fail in a stable short circuit mode as the copper CPPGA structure retain the spring function and a stable clamp is formed.

Figure 8C:
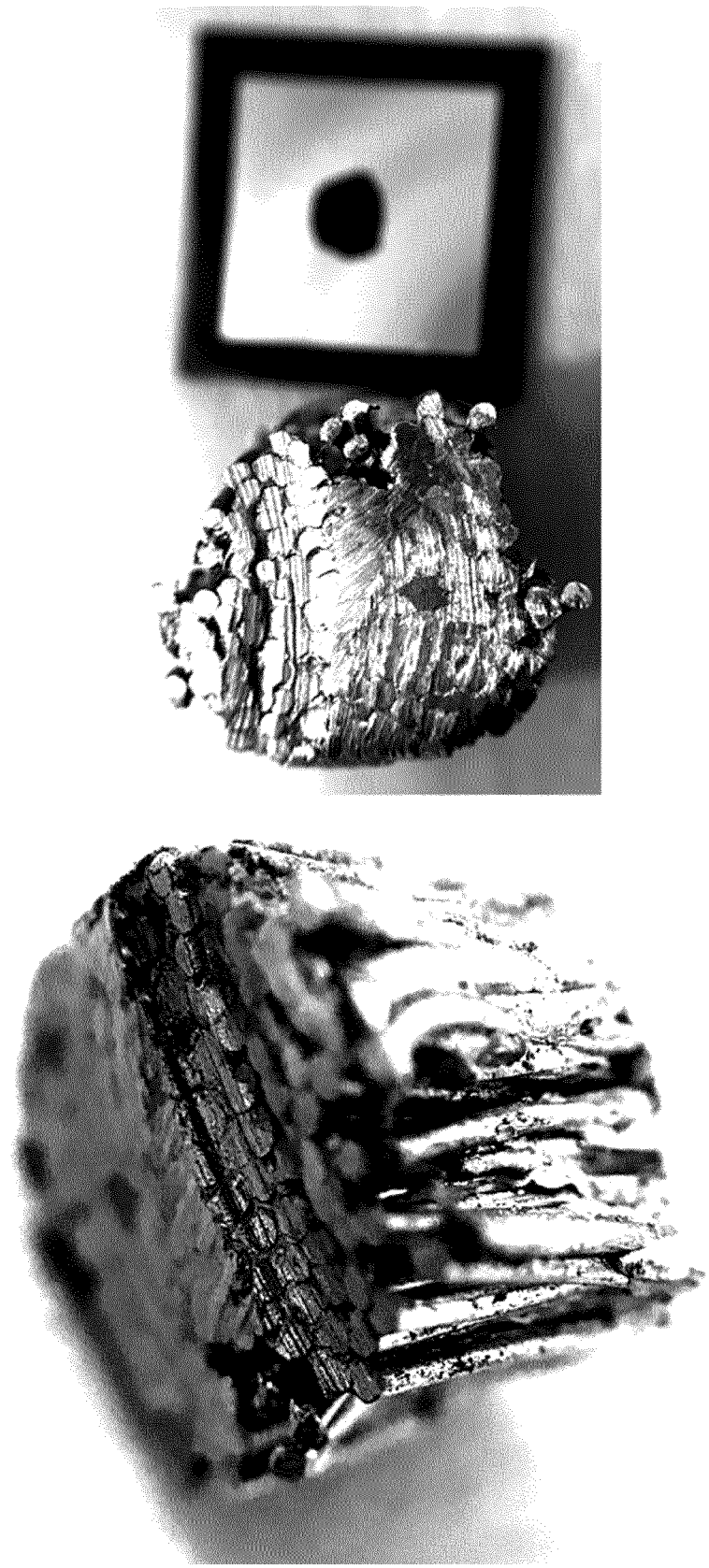
FIG. 8c shows a photo of an actual CPPGA structure comprising tightly packed copper wires (CPPGA-p) according to one embodiment of the present disclosure.
Figure 11:
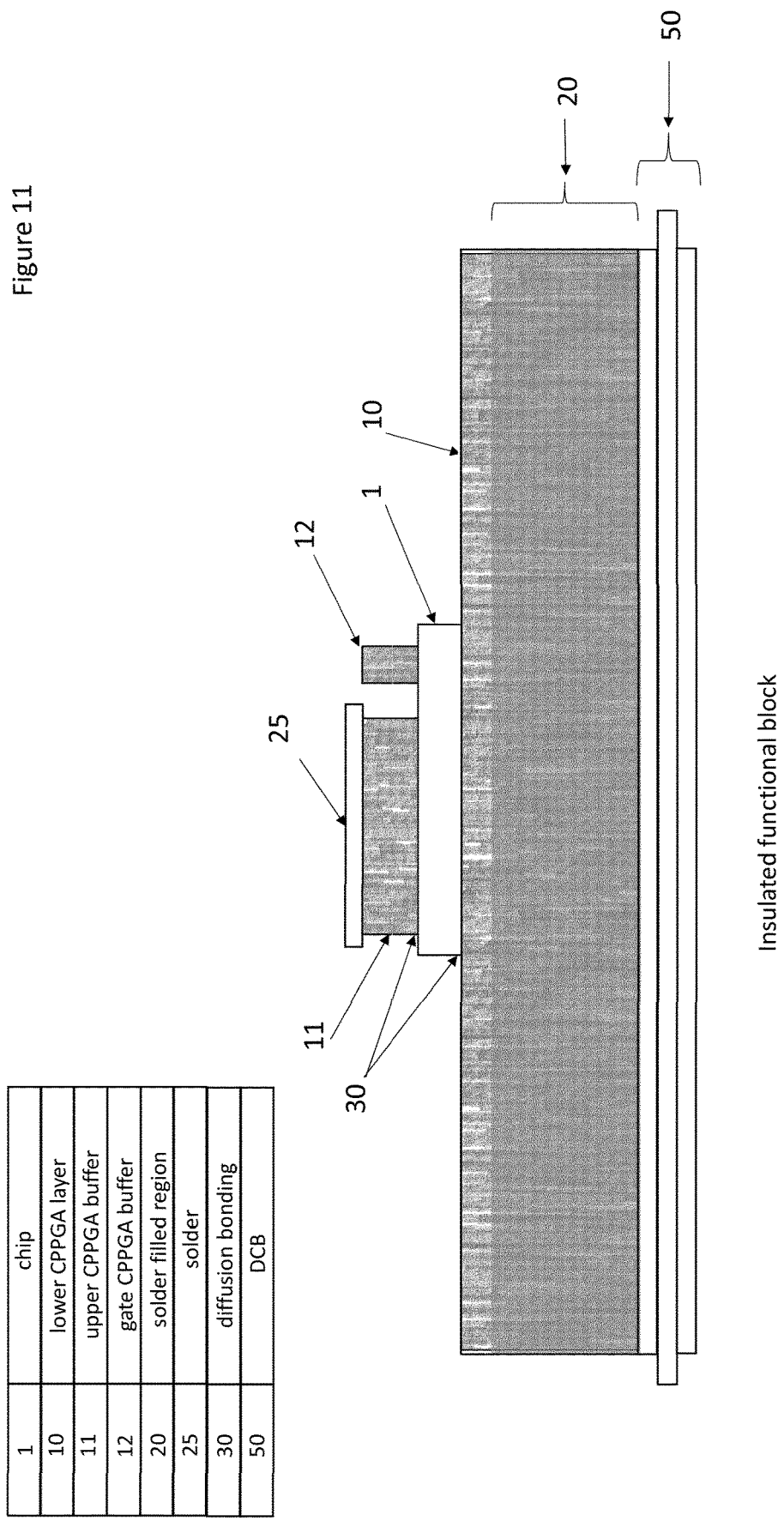
FIG. 11 shows a thick CPPGA structure which is used also as a heat spreader and current lead according to one embodiment of the present disclosure.

CPPGA Application as Heat Spreader (FIG. 8C, 11)

The CPPGA structure has been introduced as a buffer between adjacent mismatched TEC materials. The minimal structure thickness is connected to the height/width ratio of the pins composing the structure and the desired flexibility. The maximum structure thickness is not constrained and the CPPGA can absorb other roles than just strain relief buffer material. (FIG. 11) Given the thickness is significant it can absorb the role of heat spreader hence applying the FIMOLO structure which represents the optimal solution for thermal management. A bare CPPGA has a very anisotropic behaviour regarding thermal and electrical conductivity which is close to bulk in the preferred direction (parallel to the pins) while it can be very poor in the normal direction as the mechanical contact between the pins is very poor. Embedding the pins in a conductive matrix, like soft solder or hard solder or conductive resin, the lateral transmission path becomes significant and can match solid material, as nearly all the volume is occupied by the pins and the empty volume is filled with a conductive matrix, eventually further including conductive powder or whiskers.

The part of the CPPGA filled with a matrix will stiffen the structure but it is possible to apply any one or more of several methods to retain the good matching behaviour:

Using a soft filler, like soft solder or soft resin, keep the lateral stiffness of the structure to a low level and allow for a low stress joint.

It is possible to fill the CPPGA only partially leaving free of the matrix a layer of proper thickness to retain all the buffer qualities.

It is possible to build a CPPGA which is filled with protruding parts which are not filled.

It is possible to introduce differentiated filler like soft resin in the body and a solder layer on the faces which is quantified to migrate to the metallization surface by capillarity leaving a volume of nearly free pins of given thickness.

Moreover, it is helpful to note that using a soft filler, the filled CPPGA structure is soft hence the minimum thickness of free CPPGA to have a very effective buffer behaviour can be very small.

It is particularly advantageous to note that leaving an unfilled thickness, the unfilled surface is an outstanding element to join other materials like resin or different mold as the penetration in the interstitials of the pins allow for a very strong joining capability removing other concerns like shown in FIG. 8e).

It is particularly advantageous to note that potentially it is possible to use any material to join the elements together especially under compression.

It is possible to join a resin insulation layer using resin filler in the CPPGA structure.

It is possible to join a ceramic insulation layer using a specific brazing solder or using a resin filler.

It is possible to join a ceramic insulation layer using and electrically activated sinterization between the two structures and then proceed to fill the structure.

It is possible to use CuZn brazing filler for the bulk. Note CuZn brazing filler offers thermal conductivity in the range of 100 to 250 W/mK and the thermal performance are undistinguishable from Cu solid Soft solder: SAC 60 W/mK, SnAg 80 W/mK (CPPGA structure lateral thermal performance are 25-30% less than solid reaching approximately 300 W/mK); and/or Since the pins are macroscopic elements, it is possible to use a highly conductive powder of different mesh to further fill the Soft solder like Cu or Ag powder or whiskers.

CPPGA Application as Mechanical Matchmaker

Power devices are typically composed of thin layers of different materials that have to match closely to achieve good contact. These layers have a thickness between a few millimetres to a few tenth of micrometres and an area from a fraction of square centimetre to hundreds of square centimetres. The large difference in scales typically imposes demanding requirements for mechanical flatness and roughness which contribute to increase the process criticality (e.g. solder thickness uniformity, DCB warpage, Mo shim contact quality) and/or cost.

Figure 12B:
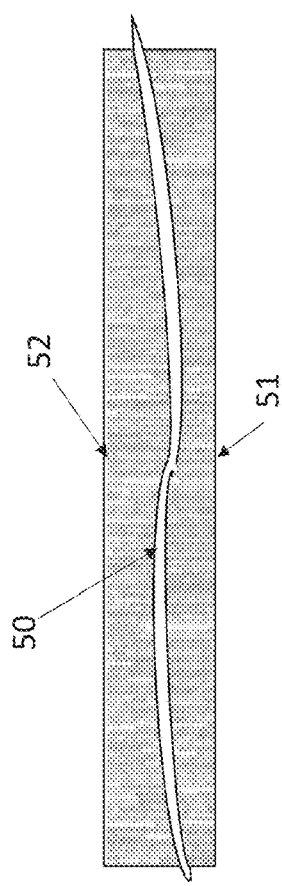
FIG. 12b shows a very thin substrate which is affected by significant warpage embedded in a CPPGA structure according to one embodiment.

As discussed, CPPGA is very tolerant to mechanical unevenness, especially roughness and flatness, allowing to relax the mechanical quality requirement of the components. Typically, the most challenging parts to achieve the required mechanical properties are ceramic based components. CPPGA application to the ceramic substrate allows us to relax the required flatness according to the CPPGA thickness. An application to form a substrate using a warped ceramic is shown in FIG. 12b. This allows employing very thin ceramic substrate which are actually not feasible as they lack the mechanical toughness to resist the thermal induced stress. Moreover while it is very difficult to produce thin ceramic of controlled warpage matching actual dimensional requirements, while it is feasible with the present proposal relaxed requirements.

CPPGA application to resin/mold integration or encapsulation allow for the resin/mold to penetrate the space between the pillars and fill totally or partially the CPPGA structure as shown in FIG. 9e. In this situation the adhesion of the resin/mold to the CPPGA structure is extremely strong as not only the exposed surface is orders of magnitude larger than the connection with a flat surface, but also the mechanical gripping effect of the pillars embedded in the resin/mold add to the structure join strength.

CPPGA Application as Heat Treatment Deformation Reduction Element

Due to the large CPPGA structure compliance, the residual deformation after heat treatment of the power device is greatly reduced. This allows us to relax design complexity of components shapes.

CPPGA Application as Spring

CPPGA pins can be vertically loaded as a buckling spring. Collectively they offer a significant spring capability which can transmit the mechanical load very evenly on the CPPGA covered surface. As a spring the CPPGA can be designed to offer a given force-displacement curve and it can be designed to offer several millimetres of controlled displacement. This action is particularly advantageous as it allows a very even and very high pressure distribution on the chip surface as can be seen in FIG. 9h). This capability can be used to replace all the components of the hockey-puck structure as a thick CPPGA can replace all the elements between the chip and the electrodes and actually as discussed previously can replace also the electrode. Shown in FIG. 13) for the press pack type and 14) for the press pin type. Moreover, this property also allows for a consistent and reliable short circuit failure mode as when the chip fails for any reason the high local temperature and temperature gradient crack the silicon crystal and partially melt the CPPGA thus shortening the path between the two sides of the chip while the large part of the CPPGA unaffected from the catastrophic failure retains its spring behaviour allowing for a consistent behaviour.

To further improve the capability of the system it is possible to inject a resin in a large part of the CPPGA thus forming a sealed construction without the use of ceramic-metal hermetic seals and elastic structures. The large displacement possible using a thick CPPGA structure can replace the spring structure employed in the StackPack structure and greatly reduce device complexity and cost. (FIG. 14)

In discrete devices and power modules the availability of spring element directly applied on the semiconductors allows us to apply the distributed pressure structure FIMED Pressure and allows us to unify all the structures design from small discrete elements to large StackPack structures, from a single diode to a complex 3D full inverter structure. See FIGS. 13, 14, 15, 16, 17, 18, 19, 21.

CPPGA Application in Power Electronics Packaging

Figure 13A:
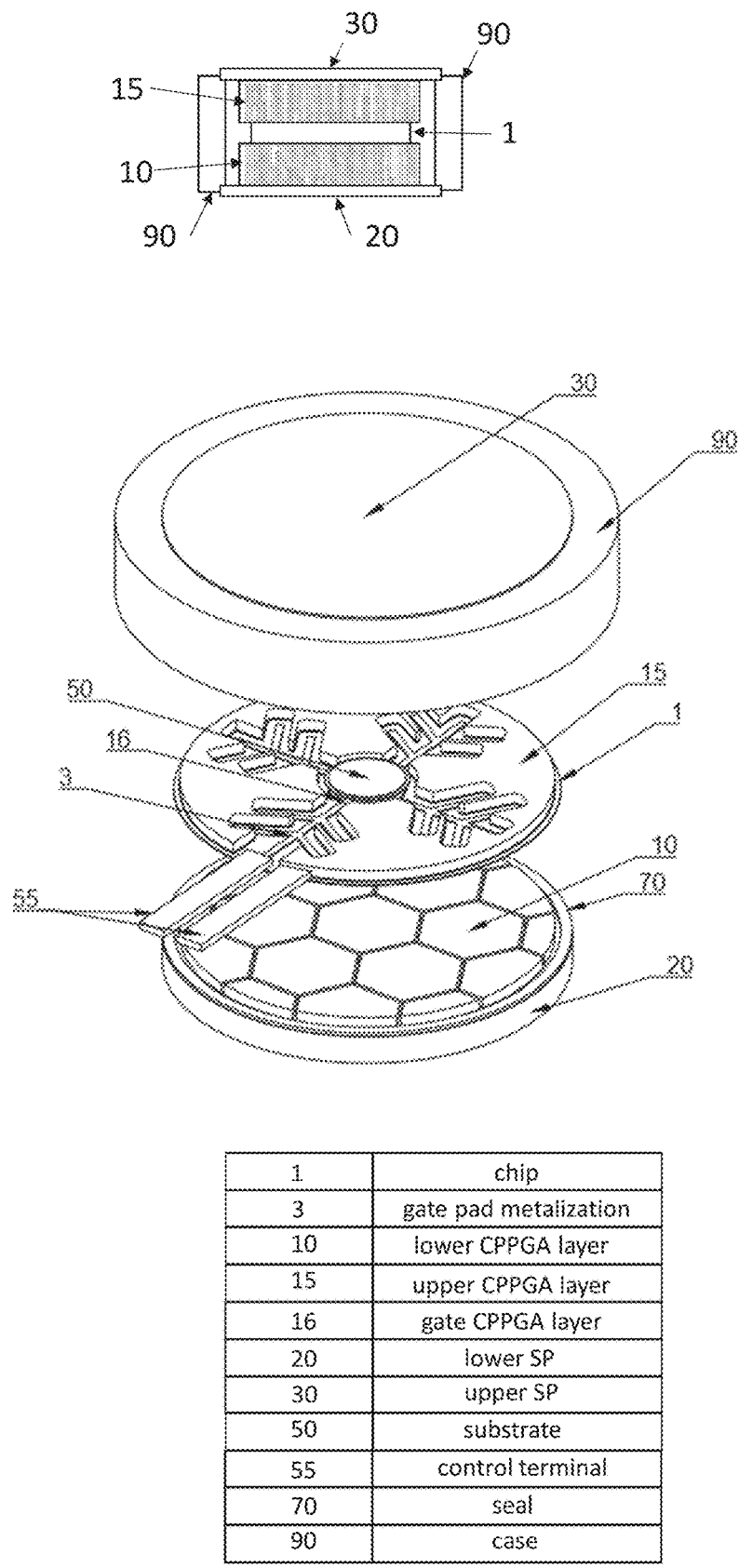
FIG. 13a shows a pressure pack realized using a CPPGA structure on both sides without any other element, which is a fundamentally symmetric structure, according to one embodiment.
Figure 13B:
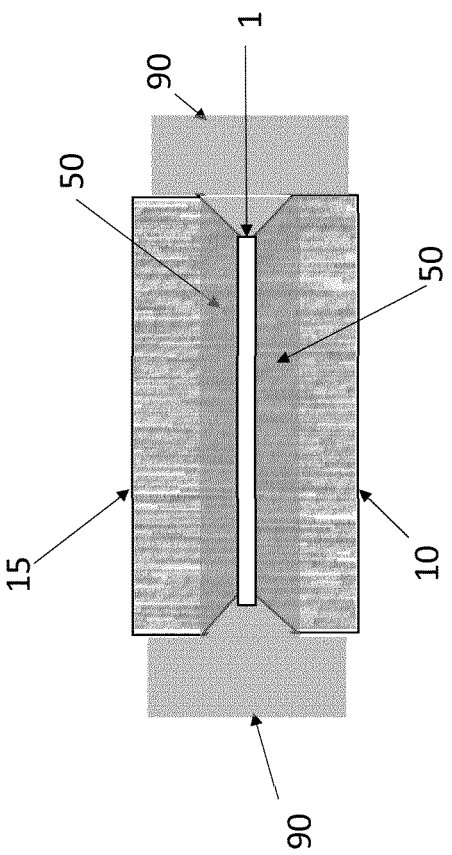
FIG. 13b—Shows a press pack or hockey puck design solution including a soft resin embedding the volume around the chip die offering hermetic protection while retaining the CPPGA layer flexibility.
Figure 14:
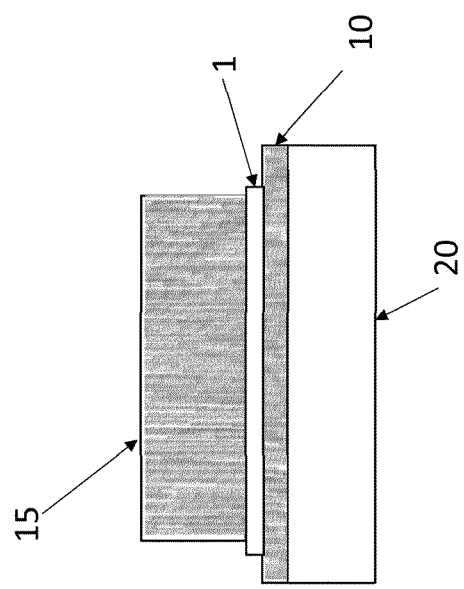
FIG. 14 shows a press pin structure using a CPPGA structure as a controlled pressure element according to one embodiment.

Using the CPPGA structure in the dual capacity as a stress relief element and for "FIMED Pressure" can be applied to all packaging devices which are meant to be mounted on a HS, like power modules (e.g. 34Pak, 62Pak, custom packaging), see FIG. 15, 18, 19 and power discrete devices (e.g. TO200, TO03), see FIG. 16, 17, 19 or structures where pressure is already used for assembly like press-pack disk cells, see FIGS. 13, 14

The CPPGA structure decouples the mechanical interaction on the horizontal plane between the chip and the thick metal electrode (SP) due to the differences in TEC. On the vertical direction the CPPGA connects together the chip and the electrode, eventually the CPPGA assumes also the role of electrode, and offers an elastic element which can be used to transmit a force through compression, delivering a fairly uniform pressure on the joined elements (chip and electrode). Typically, the structure is squeezed between a case and a HS or between two HS's or between other power devices. The CPPGA structure allows this compression to be spread on the chip without pressure peaks as it offers a low spatial correlation. The designated compression can be activated forcing a displacement on the CPPGA structure or can be activated forcing a force on the CPPGA structure.

Figure 9F:
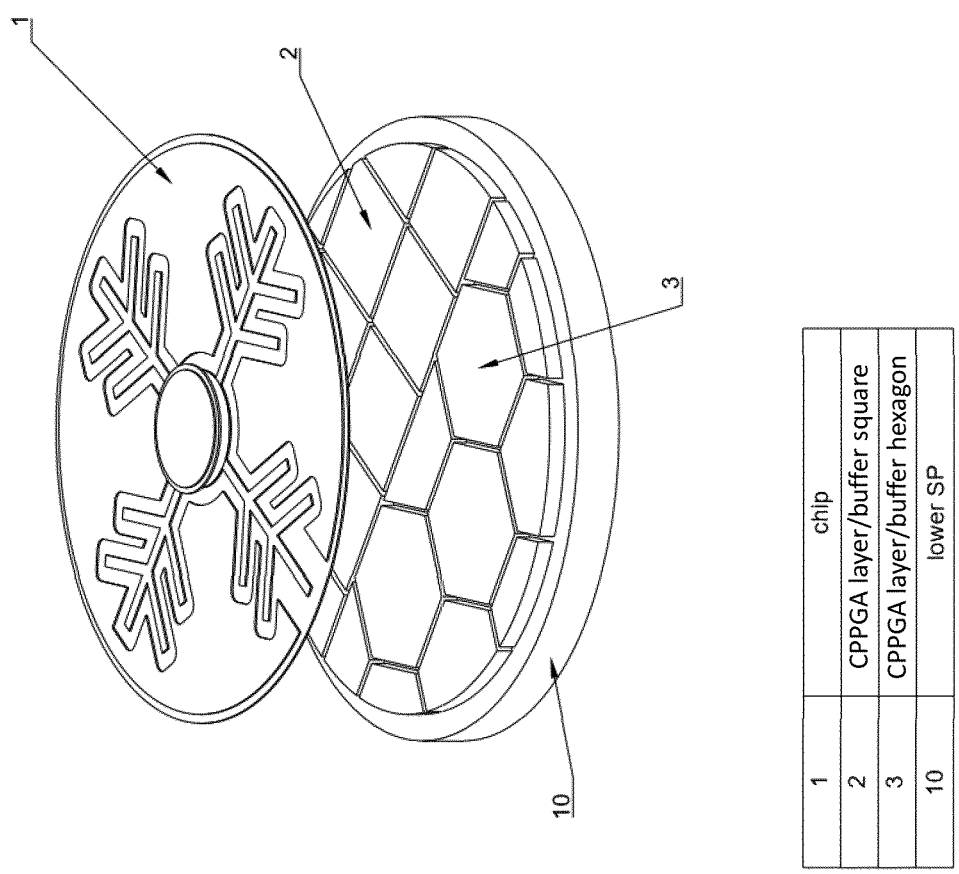
FIG. 9f shows a proposed module technology demonstrating CPPGA application for a large area semiconductor device including partitioning.

For a large SP applied for chip area divided by device area=1, like disc cells, it is possible to fraction the SP in parts which are separated by small crevices and use a single CPPGA or a similarly fractioned CPPGA to join it to the large chip as shown in FIG. 9f.

It is possible to replace a large SP with a thick CPPGA or filled CPPGA as discussed and shown in FIG. 11, 13a, 13b, 14, 17.

When the CPPGA is applied on all the area of the device e.g. to join a substrate, the pressure distribution between the device and the HS is further improved.

Figure 12A:
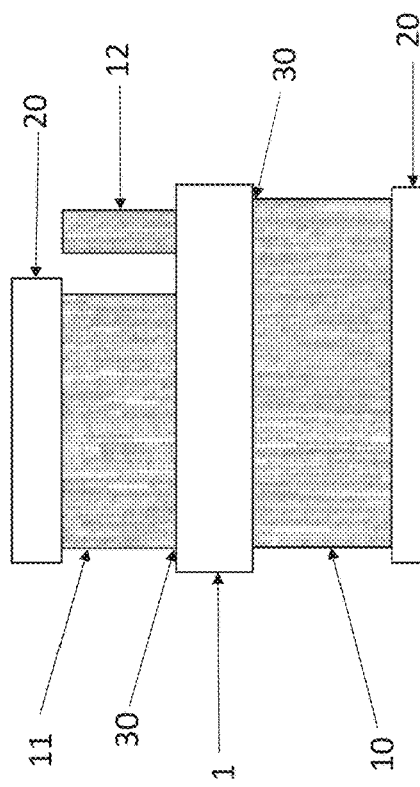
FIG. 12a shows a chip functional block where CPPGA is used around a semiconductor to form a solder ready element according to one embodiment.

The CPPGA can be used to prepare building blocks for power devices as (not limited) any one of more of:
A thin CPPGA as chip buffer as shown in FIG. 8a
A chip equipped with thin CPPGA as shown in FIG. 12a
substrate including a CPPGA structure as shown in FIG. 12b
Electrodes equipped with CPPGA as shown in FIG. 9e
Thick CPPGA structure as electrodes (FIG. 9e, 11)
Thick CPPGA structure as electrodes and chip buffer (FIG. 11); and/or
Resin/mold adhesion enhancer as shown in FIG. 9e The availability of such building blocks allows us to simplify and rationalize the design and production of power devices and allows us to reduce development costs and production costs even for small series while opening an enormous design freedom.

As we have stated the CPPGA allows us to optimize the inter-connections between the heat flux cross-section in the layering, the minimisation of TIM's thermal resistance (given by type of TIM and thickness) and the DCB substrate's thermal resistance (given by type of insulator and thickness).

Combining "FIMOLO" with the "FIMED Pressure" resulting from the CPPGA structure capabilities, it is possible to optimize cost and thermal performance solutions for every chip size/available area.

Particularly the proposed (Finar) module structure offers the widest thermal flux cross-section because of the advantage of the CPPGA structure, the chip is directly joined to the SP element (being it a solid element or the CPPGA itself) above the DCB ("FIMOLO") and TIM thickness is minimized as a result of significant, uniform pressure (resulting from "FIMED Pressure" resultant from the CPPGA springing capabilities) at the interface between the device and HS under all thermal load conditions.

"FIMED Pressure" allows for a constant and evenly distributed device-HS contact pressure under all thermal load conditions, allowing the TIM thickness to be minimized beyond any previous results. Given any thermal conductivity of the TIM, the minimum thermal resistance is obtained when the heat flux area is maximized.

CPPGA structure allows for unprecedented reliability as the TEC mismatch stress is virtually removed, electrode resistance and parasitic are greatly reduced thus improving voltage stress capability, chip border insulation can be enhanced introducing locally highly insulating materials, short circuit capability are significantly improved as both thermal mass increase and thermal resistance decrease occur at the same time.

Any one or more of the following advantages may also, or alternatively, be achieved:

Bonding can be removed by applying 3D structures (FIG. 16,17, 18, 19).

Maximum current density (in the bonding wires) is reduced

Forward voltage is reduced thanks to a thick highly conductive element and very uniform current distribution at chip metallization; and/or Chip metallization can be simplified thanks to an effective dry contact or to the direct electric current activated diffusion bonding enabled by the CPPGA structure.

FM Solderless High-Pressure Construction

The combination of the CPPGA structure and "FIMED Pressure" can be used to exert high pressure within the device enabling to have solderless joints.

FM Solderless High-Pressure Construction, shown in FIGS. 13, 14 is particularly advantageous because the CPPGA between the chip and the copper, when we have large chips and a press-pack configuration, has similar or better electrical and thermal properties than molybdenum and "FIMED Pressure" ensures uniform contact pressure on all the chip surface, virtually removing any pressure peak and opening the possibility for even higher average pressure. It can be noted that high pressure between the CPPGA pins and chip metallization can lead to Electric current activated or assisted diffusion sintering between the pins and the metallization itself and between the pins and the leads.

It can be noted that this construction can actually be extended to any device size from discrete to low voltage power module to high voltage modules and studs, to disc cells and press pack configuration.

It can be noted that electric current activated or assisted diffusion bonding between the CPPGA structure and the chip metallization can occur during operation.

Augmented "FIMED Pressure"

It can be noted that "FIMED Pressure" can be applied out of the chip area and actually require an elastic structure not necessarily a CPPGA. An application of distributed elastic elements is shown in FIGS. 15, 17. This structure is similar to "SKiiP" but the introduction of the thick CPPGA layer as spreader and the application of "FIMOLO" is crucial to the performance difference. It can be noted that the elastic structure can be applied on a vast portion of the device area.

It can be noted that the elastic element outside the chip area has less demanding characteristics to be fulfilled, like a lower concern about electrical and thermal conductivity. Moreover, the concern about different TEC is absent as the elastic element lay between two metal electrodes including one side insulated eventually by substrate. Given that the thermal and electrical conductivity are not critical and the stress relief capability is not necessary, there is no use for anisotropic behavior of the foam which can be of different material like plastic or ceramic foam which offers good insulation capabilities and highly linear pressure response and long life reliability in high temperatures conditions, (actual silicon semiconductor operating up to 175° C., whilst new generation silicon carbide semiconductor could operate at higher temperatures than 250° C.).

Actually, it is possible to consider the use of a foam mold which form an insulating resin or plastic foam offering mechanical performances which can be defined by the mold chemical composition and the foaming agent. As shown in FIG. 17.

Other Electronic Devices Applications

It can be noted that CPPGA (or Finar Buffer), FIMOLO, FIMED Pressure can be applied to any electric and electronic device in which an efficient thermal conductivity from the chip to an HS is desirable such as sensor technology and high intensity LED which can greatly benefit from the present technology.

GENERAL DESCRIPTION OF DIAGRAMS

FIG. 1—Typical Structure of a Power Module—Cross Section shows the standard construction for a power module including chip dies 1, a DCB 2, wire/ribbon bonding 3, terminals 4, a baseplate 5 with its mounting holes 6, a TIM 7, the HS 8 and the bolts to mount it 9.

FIG. 2—Semikron "SKiiP" Structure of a Power Module shows the Semikron "SKiiP" design power module, including chip dies 1, a DCB 2, wire/ribbon bonding 3, a module cover 4 including the elastic elements 5, the terminals 6 and its mounting holes 7, a TIM 8, the HS 9 and the mounting bolts 10.

Figure 3:
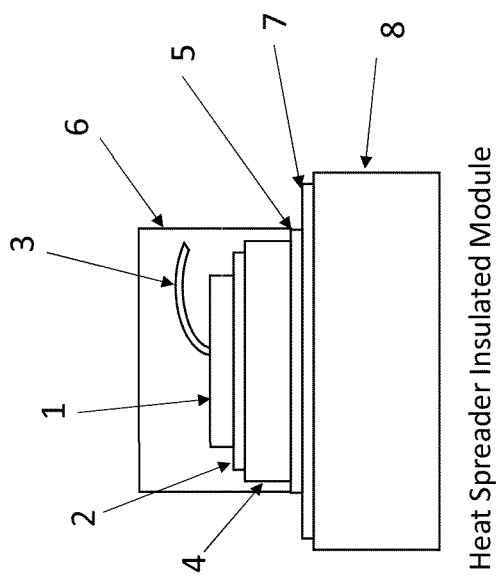
FIG. 3 is a drawing of the concept for SmartPak and Mitsubishi T-Mold power module design (heat spreader insulated module)

FIG. 3—Smartpak or Mitsubishi transfer mold structure of Power Module shows the Smartpak and Mitsubishi transfer mold conceptual structure including chip die 1, the conductive resin or thick solder 2 join to the thick copper spreader 4 and the wire/ribbon bonding 3, the substrate 5 composed directly from the mold (Smartpak) or a specialized resin layer (Mitusbishi), the embedding matrix 6, a TIM 7 and HS 8.

Figure 4:
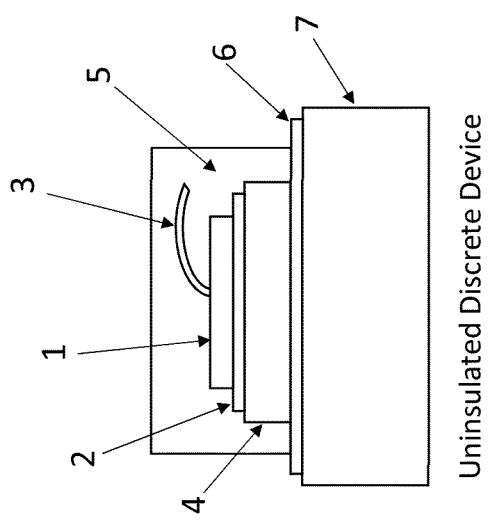
FIG. 4 is a drawing of a known uninsulated discrete device design.

FIG. 4—Uninsulated discrete device Structure of a Power Transistor or Diode mounted without insulation on a heat sink, including chip die 1, thick solder 2, wire bonding 3, the lead 4, the mold 5, a TIM 6 and HS 7.

FIG. 5—Press pack or hockey puck or Westinghouse design, Structure including chip die 1, molybdenum buffer 2, thick copper leads including elastic border 3 and the case 5.

FIG. 6—Press pin design, Structure including chip die 1, molybdenum buffer 2, single chip elastic structure 3.

Figure 7A:
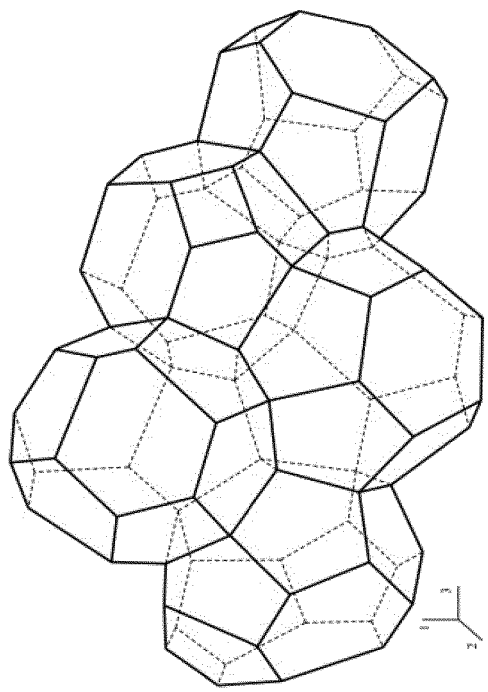
FIG. 7a shows a known open cell foam structure.

FIG. 7a—Open foam structure.

Figure 7B:
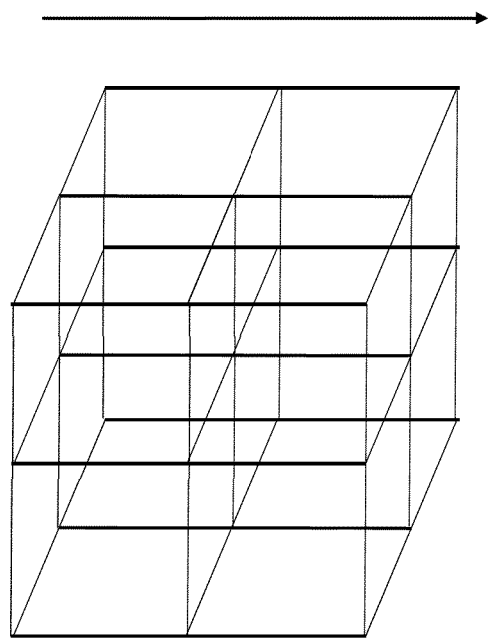
FIG. 7b shows a known simplified model of open cell foam structure.

FIG. 7b—Foam conceptual model representation.

Figure 7C:
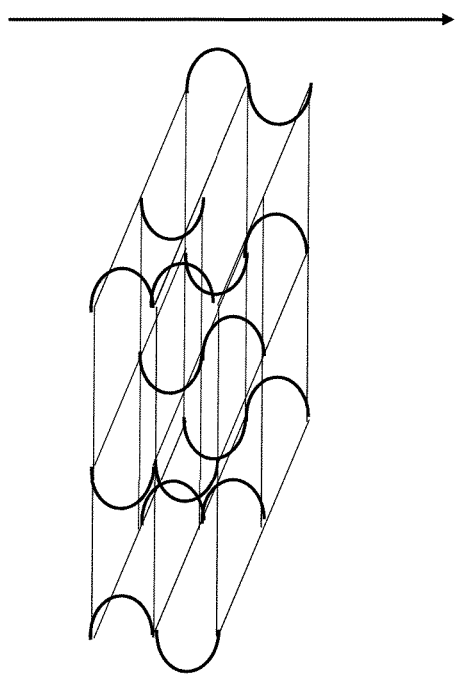
FIG. 7c shows a known one or mono-directional compressed open cell foam and its behavior.

FIG. 7c—Foam conceptual model representation under 1D compression deformation along the preferred direction.

Figure 7D:
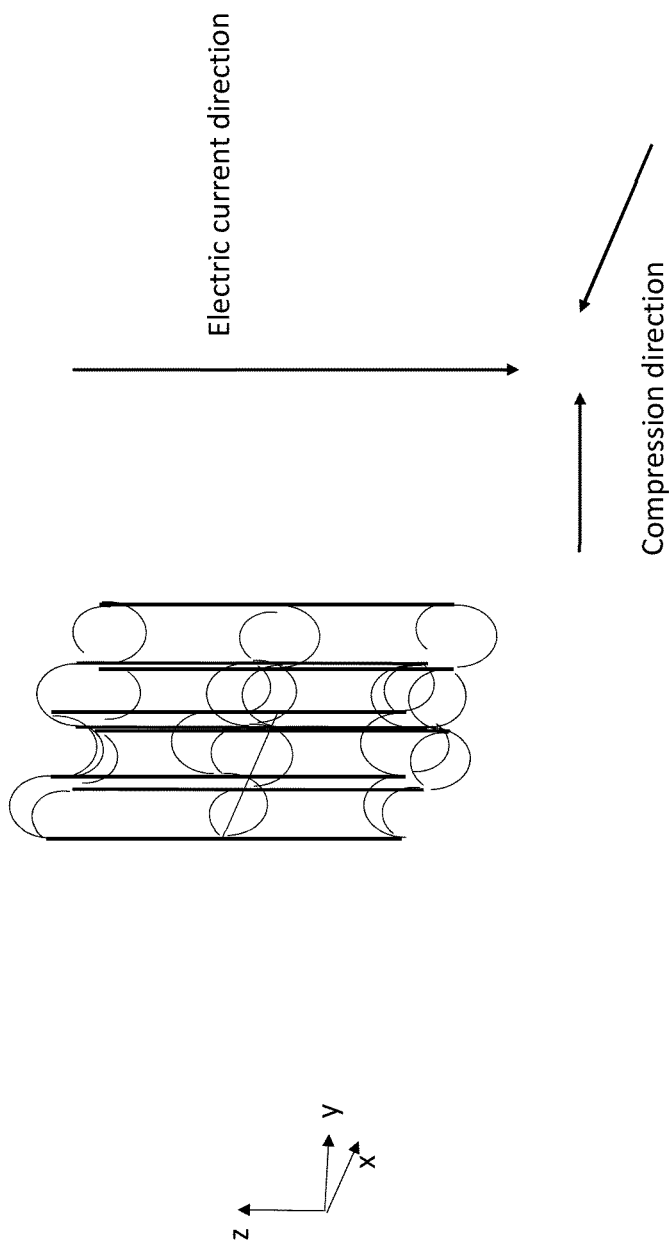
FIG. 7d shows a known 2 directional lateral compression open cell foam and its behavior.
Figure 7F:
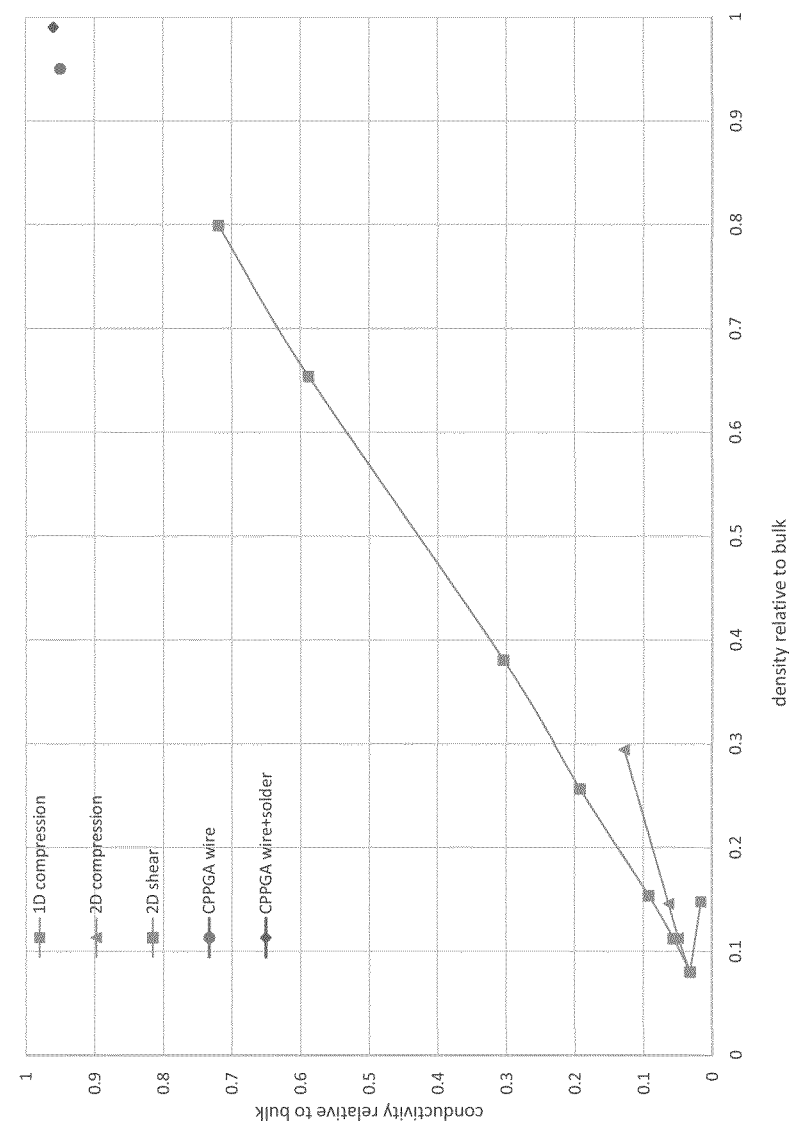
FIG. 7f shows the electrical performance of compressed foam, shear deformed foam and wire CPPGA.

FIG. 7d—Foam conceptual model representation under 2D compression deformation along the plane perpendicular to the preferred direction.

FIG. 7e—Foam conceptual model representation under 2D shear deformation along the planes parallel to the preferred direction. Including a detail image of a foam part and the same part after shear deformation application.

FIG. 7f—Experimental electrical conductance along the preferred direction measurement depending on structure density compared to bulk material on different structures including 1D compressed foam, 2D compressed foam, 2D shear deformed foam, the wire formed CPPGA and solder filled wire formed CPPGA.

FIG. 8a—Closely Packed Pin Grid Array (CPPGA) structure shown as a complete structure body 1 and the composition in closely packed single pins 2 shown in the inset.

FIG. 8b—CPPGA structure behavior as buffer between two mismatched TEC material thermal dilatation. And the behavior on roughness and unevenness as long as it is small compared to the height of the pin.

FIG. 8c—wire composed CPPGA using solder resin to keep the shape

FIGS. 9a to 9h—Finar Module Technology for a generic power device demonstrating CPPGA application around the chip and the various possible methods of wiring management on the chip's control gate pad:

This set of diagrams shows Finar Module Technology and various methods of wiring management and insulation on the chip's control gate pad. These diagrams consider a chip using 100 um to 500 um thick copper CPPGA at >80% density. The chip 1 is placed between an upper CPPGA buffer 15 in turn attached to an upper electrode 30 and a lower CPPGA buffer 10 in turn attached to a lower electrode 20. The control gate pad 2 and wiring 54 is preferably connected while granting a high insulation and a low parasitic capacity toward the main electrodes 20, 30. Moreover, it is fundamental to avoid any uncontrolled bending of the chip hence the elastic, pressure exerting CPPGA 10, 15 on both sides of the chip, have to be shaped to match each other and account for the control gate pad, wiring and insulation.

FIG. 9a—Shows a situation in which the control gate pad area 2 is left uncovered by the CPPGA buffer 10, 15 and no pressure is exerted on it (the perimeter of the each CPPGA buffer 10, 15 follows the power metallization area 6). To balance the mechanical pressure on the chip, the CPPGA 10, 15 facing each other through the chip 1 preferably matches the shape at least at chip contact leaving an open space over and under the control gate pad 2. An insulated connection is then placed on the gate. A possible realization is using an insulated wire 54.

FIG. 9b—Shows a situation in which the control gate pad 2 is covered by the upper CPPGA Buffer 15 and pressure is exerted on it. In this case an insulating element 41 is preferably inserted between the control gate pad 2 and wiring 54. To balance the mechanical pressure on each side of the chip 1, the upper CPPGA Buffer 15 covering the control gate pad has to account for the wiring and insulation elements thickness and stiffness. The insulation element 41 covering the control gate pad 2 typically has a thickness between 25 um (e.g. polyimide sheet) to 200 um (e.g. mica or $Al_2O_3$ sheet). The corner of the upper CPPGA Buffer 15, above the control gate pad can be mechanically prepared to host the insulating element 41. Alternatively the entire corner of the upper CPPGA Buffer 15 can be removed (as in FIG. 6a) and the insulating element 41 can be modified to have the same thickness as the upper CPPGA Buffer 15.

FIG. 9c—Shows a situation where the upper electrode 30 relative to the control gate side is part of a DCB and proper tracks electrically separate and support two separate CPPGA Buffers, The upper CPPGA Buffer 15 on the power metallization area 6 and another upper CPPGA Buffer 17 on the control gate pad 2. The same upper electrode can be used to manage all signals and control routing, eventually embedding logic elements and passive elements like shown in FIG. 6b.

FIG. 9d—Shows a situation where the thick electrode SP 20 is joined to a CPPGA Buffer 10 which in turn is joined to a DCB 40. In the present case all angles and/or corners (internal and external) of the shape of the SP 20, DCB 40 and if necessary the CPPGA Buffer 10, are rounded to lower the maximum thermal induced mechanical stress (see FIG. 4). As a reference, all angles and/or corners (internal and external) on the horizontal plane, should have a radius of at least 1 mm in a preferred embodiment.

FIG. 9e—Shows a situation where a thick CPPGA layer 1 is joined to a resin/mold layer 2 and part of the CPPGA layer 1 is filled with the resin/mold 2 for a depth 3 granting extreme joining strength.

FIG. 9f—Shows a situation of a realization for a large area chip 1 using several CPPGA Buffer patches placed between the chip 1 and the electrode SP 10 Shapes considered are squares 2 and hexagons 3 and parts of them according to the chip shape and border, having side width depending on strain relief layer thickness. Eventually the CPPGA buffer 2/3 can absorb the function of the electrode SP 10 and become a thick CPPGA layer.

Figure 9G:
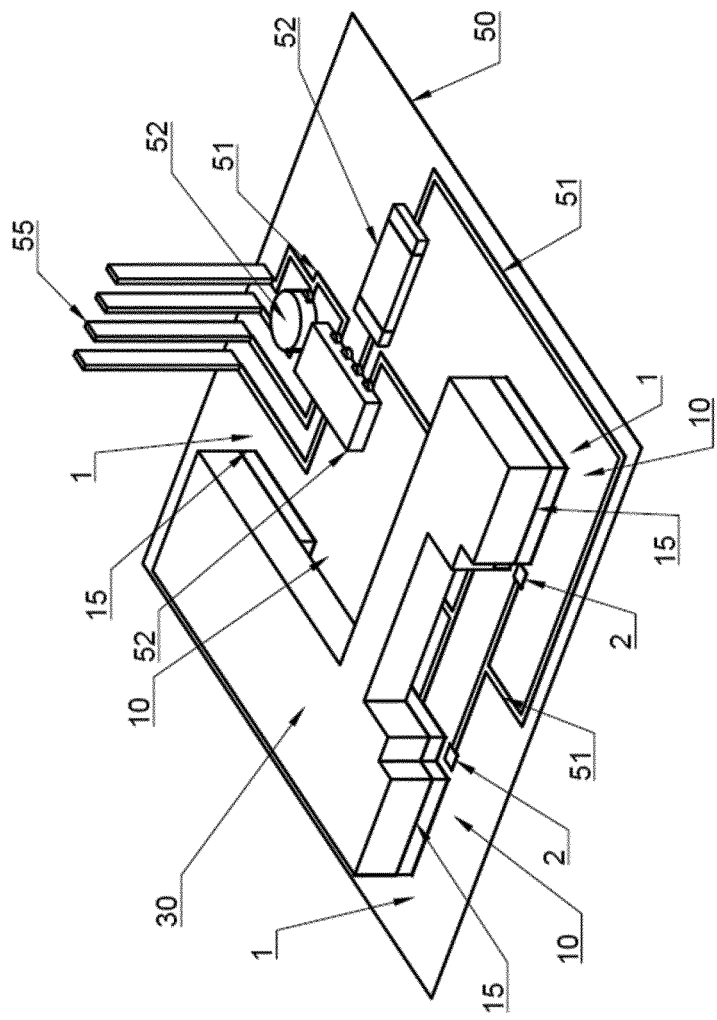
FIG. 9g shows a proposed module technology for CPPGA application to a complex module including control electronic devices according to one embodiment of the present disclosure.

FIG. 9g—Shows a generic switch comprising transistors and a diode dies chip 1, which are connected to thick solid leads (upper SP 30 visible) through lower CPPGA buffer and upper CPPGA buffer 15, an insulating foil 50 carries the signal and control routing 51 to electronic devices 52 embedded in the module case connected to the external circuitry through the signal terminal 55.

FIG. 9h—Shows the pressure distribution on a chip die for different CPPGA shapes.

FIG. 10—Shows the structure of a readily solderable chip block where the join between the chip die 1 and the lower CPPGA buffer 10 and upper CPPGA buffer 11 has been realized using the electric field assisted diffusion bonding 30. The external faces of both lower 10 and upper 11 CPPGA buffer are prepared with a solder layer 20 to readily join other elements of the electronics device, FIG. 11—Shows an insulated transistor structure realizing the FIMOLO using a CPPGA layer. The chip die 1, is joined to a lower CPPGA layer 10 as lead and SP and an upper CPPGA buffer 11 which is solder ready to connect to the upper lead 25. A gate CPPGA buffer 12 allows for transistor control. A part of the lower CPPGA layer 10 is solder filled 20. The lower CPPGA layer 10 is directly soldered to a DCB 50.

FIG. 12a—Shows the application of CPPGA buffer and layer to form functional blocks to be employed to simplify the electronic devices design and production process. An example is a solder ready chip block including the chip die 1 and the lower CPPGA buffer 10 and upper CPPGA buffer 11 joined electric field assisted diffusion bonding 30. The external faces of both lower 10 and upper 11 CPPGA buffer are prepared with a solder layer 20 to readily join other elements of the electronic device.

A second example, shown in FIG. 12b, is a CPPGA buffer assisted substrate easily solderable, offering outstanding joining capability to solder, resin or mold, offering an outstanding adhesion capability to TIM, ready to be employed in the production process to allow the application in the field of tough, ultrathin ceramic plates suffering from significant warpage 50 covered by a lower CPPGA buffer or layer 51 and an upper CPPGA buffer or layer 52, eventually machined to the required flatness, greatly reducing product cost, process time and thermal resistance while keeping high insulation and good external mechanical standard.

FIG. 13a—Shows a press pack or hockey puck design employing a thick CPPGA layer as spring element, SP and leads. The chip die 1 is in dry contact or soldered or diffusion bonded or joined to a lower CPPGA layer 10 and an upper CPPGA layer 15. These are joined to a lower SP and an upper SP which eventually include an elastic lip. A gate CPPGA layer 16 connect the gate to the control terminal 55. A case is hermetically sealed on the SP.

FIG. 13b—Shows a press pack or hockey puck design solution including a soft resin embedding the volume around the chip die offering hermetic protection while retaining the CPPGA layer flexibility. The CPPGA layers can be used directly as power leads. The schematic includes the chip die 1, the lower CPPGA layer 10, the upper CPPGA layer 15, the region of the layers which is filled with soft resin 50 and the case 90, which eventually can be formed during the resin/mold injection FIG. 14—Shows a press pin solution. The chip die 1 is joined to a lower CPPGA buffer which substitutes the Molybdenum buffer, which is joined to a lower SP 20. On the upper side an upper CPPGA layer 15 is designed of proper length to offer the desired spring capability and can replace the present spring mechanism shown in FIG. 6).

FIG. 15—Shows a single side cooling pressure enabled Intelligent Power Module (IPM). The structure offers significant elasticity and when the IPM is assembled on the HS, the structure is pressed between the case and the HS. The pressure is applied along all the components supported with the elastic CPPGA elements including the chip die. The structure represents an inverter phase leg including a low side switch and a high side switch. The IGBT chip die 1 and the DIODE chip die 3 are joined to a lower SP low side 20 and a lower SP high side 21 through a lower CPPGA buffer. They are joined to an upper SP low side 30 and an upper SP high side 31 through an upper CPPGA buffer 15. The connection between the high side SP is performed using an auxiliary CPPGA buffer 17. Similarly the power terminals 25, 26 and 35 are supported using auxiliary PPGA buffer 12. The lower SPs are soldered on a DCB 40 while an insulating foil 50 host the routing 51 for the control signals going to the IGBT gate pad 2. Passive and active electronic elements 52 offer intelligence on board and simplify external circuitry and are connected to control terminals 55. The case 90 is designed to exert pressure on the upper SPs during assembly. The mounting holes 91 are at the periphery of the case but the pressure is evenly distributed on all the plane thanks to the CPPGA buffer elements elasticity.

FIG. 16—Shows a single-sided cooling device employing FIMOLO and FIMED PRESSURE using a CPPGA layer sealing the internal element with a insulating gel. The structure includes the semiconductor chip die 1, a lower CPPGA layer or buffer 10 which is soldered 20 to the power terminals 25, an upper CPPGA layer or buffer 11 which is soldered 20 to the power terminals 25, the gate CPPGA buffer 12 which is soldered to the control terminal 26. A resin substrate 40 is glued to the bottom of the lower CPPGA layer or buffer 10. The case top 90 is stiff and designed to exert pressure on the upper elements of the device. The case is filled with an insulating gel 95 to seal the device from the environment. A TIM 100 is placed between the device and the HS 110.

FIG. 17—Shows a single-sided cooling device employing FIMOLO using a CPPGA layer and expanding the pressure capability on all the devices using an elastic and/or foamy filler for the device case. The structure includes the semiconductor chip die 1, a lower CPPGA layer or buffer 10 which is soldered 20 to the power terminals 25, an upper CPPGA layer or buffer 11 which is soldered 20 to the power terminals 25, the gate CPPGA buffer 12 which is soldered to the control terminal 26. A resin substrate 40 is glued to the bottom of the lower CPPGA layer or buffer 10. The case top 90 is stiff and designed to exert pressure on the upper elements of the device. The body of the case is formed with a closed cell foam 95 to embed the device in a springy element. A TIM 100 is placed between the device and the HS 110.

FIG. 18—Shows a two-sided cooling 3D structure comprising a 2 level (e.g. high side and low side phase leg) semiconductor device. The structure includes the low side chip 1 which is joined to a low side lower CPPGA layer 10 which is connected to a lower SP which is insulated with a lower substrate 50. On the top of the low side chip 1 is placed a low side upper CPPGA layer 11 which is connected with the middle SP 25. This is connected to the high side lower CPPGA layer 15 and the high side chip 2. On the top of the high side chip 2 is placed the high side upper CPPGA layer 16, the upper SP 30 and its insulation upper substrate 55. TIM 100 and HS 110 is placed on both sides of the structure.

FIG. 19—Shows a two-sided cooling resin/mold embedded insulated device. The structure includes a chip 1, which is joined to a lower CPPGA layer 10 which is connected with a lower insulating foil 40. On the top of the chip 1 is placed an other an upper CPPGA layer 15 which is connected with an upper insulating foil 45. The device is protected using a resin or mold which forms the case 90. The resin/mold can fill partially or totally the CPPGA layers 50. Eventually to improve heat spread it is possible to fill partially the CPPGA layer with highly conductive filler as discussed.

FIG. 20—Shows an application of the 2D shear deformed foam for heat sink application. On the left of the page, an actual photo from a 50 ppi Cu open cell foam 7% starting density 2 side shear deformed to 40˚density. It is possible to observe the strong vertical bias of most of the wires of the structure. It can be observed the wires are elongated and not twisted in S shapes characteristic of buckling.

On the right of the page, the photo from the publication publication "Thermal Applications of Open Cell Metal Foams" B. Ozmat et al. Published in Materials and Manufacturing Processes, Special Edition, Vol. 19, No. 5, pp. 839-862, 2004 showing a 30 ppi 8% dense Cu open cell foam biaxially compressed to 35% density. It is possible to note the tangled shape the foam has been shaped into.

FIG. 21—shows two applications of a foam heat sink. On the left an uninsulated shear foam heat sink/lead direct cooling comprising the chip die 1 directly connected to the 20-50% shear deformed foam 100 used as power lead and heat sink for insulating liquid cooling.

On the right an insulated two-sided cooling structure which includes the chip die 1, connected to a lower CPPGA buffer/layer 10, an upper CPPGA buffer/layer 11, an insulating substrate 50 on both sides and a 20-50% shear deformed foam heat sink 100.

The following numbered statements, any one or more of which may be applicable to an embodiment, summarize embodiments of the disclosure:

1. A joint stress relief buffer for handling thermal and/or electrical and/or insulating and/or mechanical contact between potentially all different layers of a sandwich structure of power devices (with or without solder or over attach), more particularly, for handling mechanical stress induced by different thermal expansion coefficients between different layers of a power device, characterized in that the buffer has a significantly lower elastic modulus (typically from half to an order of magnitude lower) compared to both the two materials it connects at least in their plane direction, the buffer comprises: a material with strongly anisotropic mechanical properties with low elastic modulus in a horizontal direction (in the plane of said layers) and a higher elastic modulus along a vertical direction, (transverse to said layers) and has a strong hardening behaviour under compression, behaving like a spring between the said layers; wherein the buffer improves the mechanical contact between layers having different thermal expansion coefficients, eventually improving long term reliability; wherein the buffer exerts a high pressure (in excess of 100 MPa and eventually in excess of 1 GPa) that can be exerted directly on the chip; wherein the buffer used in a power device between an active electronic device like a transistor or a diode or a thyristor and a thick metal layer allows for extremely high absolute current, very low current density, uniform current distribution, higher short circuit current, increased short circuit time and more in general high long-term reliability, the buffer preferably comprising any one or more of:
   a) a sponge-like structure selected from one of a group of sponge-like structures comprising, e.g., a metal foam, a ceramic foam, a metalized ceramic foam and/or a plastic foam;
   b) a plastic structure; and/or
   c) a collapsed/compressed metal foam, such sponge-like structure providing strongly anisotropic mechanical behavior between horizontal plane elastic modulus and long, slow rising hardening behavior and highly compressed vertical direction having a higher elastic modulus and strong hardening behavior; wherein the buffer has either a uniform density or a spatially distributed density, wherein further, the buffer is preloaded in a compression phase and the hardening behavior allowing for a slowly changing strain-stress curve and elastic behavior to be retained during thermal cycling solicitation,
2. The buffer of feature set 1, wherein the buffer is designed to offer a spatially controlled pressure distribution.
3. The buffer of feature set 1, wherein the buffer has a significantly lower elastic modulus compared to the joining materials and a certain thickness to mechanically decouple the two materials lateral deformation during heat cycles; and deformation under heat cycles and mechanical solicitation from the two materials is well under its elastic limit;
4. The buffer of feature set 1, whereas the buffer is attachable to none, one or both of the two materials using a thin layer of joining material like solder or sintered silver or sintered copper, thin enough (typically between 100 and 500 micrometers) not to significantly change stress and strain distribution at both the junctions between the interface element and the materials layers.
5. The buffer of feature set 1, whereas the buffer is placed between a semiconductor chip and thick metal.
6. The buffer of feature set 1, whereas the buffer is placed between thick metal and a complex low thermal dilatation structure like a DCB.
7. The buffer of feature set 1, whereas the buffer is placed between two pieces of thick metal, optionally different metals, to form an elastic and flexible joint.
8. The buffer of feature set 1, whereas the buffer is placed between two pieces of thick metal, one or both of which could include insulation, such as a DCB or a mica sheet, optionally different metals, to form a spring between them and an elastic and flexible joint.
9. The buffer of feature set 1, used as a stress relief device between a heated and or cycle heated semiconductor chip and thick metal; (see FIGS. 9f, 9g, 10, 14, 15, 18)
10. The buffer of feature set 1, attached using a layer of joining material like solder or sintered silver or sintered copper thin enough (typically 20 micrometer and thinner) not to significantly change stress and strain distribution at both the junctions between the interface element and the materials layers. (see FIGS. 9a, 9b, 9c, 9d, 9f, 9g, 11, 13a, 13b, 14, 15, 17, 18).
11. The buffer of feature set 1, used as a spring between the semiconductor chip and the thick metal electrodes above and below it; (see FIGS. 9g, 10, 11, 13a, 13b, 14, 15, 17, 18).

12. A method of forming a semiconductor package including Feature set 1 to Feature set 11, comprising:
   a) a semiconductor chip, a Finar Buffer, a thick metal electrode (typically copper), an insulation layer (typically a DCB), a thermal interface material, a heat sink;
   b) an FM optimal layer order (FIMOLO) that follows the thermal flux direction and consequently enlarges the thermal flux cross-section. FIMOLO is, semiconductor chip, then thick metal electrode, then insulation layer, then thermal interface material and finally the heat sink as illustrated in the diagram of FIG. 22 (see FIGS. 11, 15, 17, 18, 21).
   c) in this configuration Finar Buffer could be utilized above the chip, between the chip and the SP and between the SP and the DCB.
   d) the thickness of the metal electrode can be optimized on the available device area compared to the chip area, (thinner for chip area divided by available area close to 1, thicker for chip area divided by available area is significantly greater than 1);
   e) an insulation element, e.g. a DCB, is bonded to a thick lower electrode, typically copper, a Finar Buffer is bonded to the thick electrode and to a semiconductor chip, another Finar Buffer is bonded to the semiconductor on the upper side, a thick upper electrode is bonded on the top of the upper Finar Buffer;
   f) Eventually an auxiliary Finar Buffer element placed between the electrodes having one or both sides insulated or being itself of insulating material. (Augmented FIMED Pressure) (FIGS. 15, 17).
13. A method of forming a semiconductor package including Feature set 12, comprising:
   a) A displacement-controlled pressure system realized using a stiff case placed on the top of the structure and a clearance between the case bottom sides and the device floor. (see FIGS. 15, 17)
   b) A force-controlled pressure system realized using a stiff case placed on the top of the structure, a clearance between the case bottom sides and the device floor, a spring system between the screws head and the stiff case which is much softer than the internal structure stiffness, a soft visual element at the case bottom (see FIGS. 15, 17).
   c) during tightening of the bolts connecting the case to the heat sink, the stiff case top presses on the structure described in Feature set 2 and the Finar Buffer (stress relief/pressure element) exerts a controlled pressure on the chip and assists the even distribution of the pressure between the device and the heat sink, thereby minimizing TIM thickness (FIMED Pressure);
   d) The initial clearance between the stiff case bottom and the device floor is closed during the tightening procedure.
   e) For the displacement controlled pressure system, when the case bottom touch the HS plane the displacement of the internal structure is complete and is equal to the initial clearance. The designed pressure is exerted on the structure depending on the structure stiffness.
   f) For the force controlled pressure system, when the soft visual element at the case bottom touch the HS plane, the displacement of the spring system under the screw exert the designed force which is transmitted through the case and the internal structure.

The designed force from the spring system produce the designed pressure through the internal structure
g) FIMOLO structure allow a good uniformity for the pressure between the power device and the HS plane.
h) A TIM is placed between the HS and the device bottom plane. TIM thickness is very thin due to the good uniformity of the pressure between the power device and the HS. (see FIGS. 15, 17).

14. A method of forming a semiconductor package including Feature set 12 and Feature set 13, comprising:
    a) a symmetric structure around the chip plane, so as to have a thermally symmetric double path to two heat sinks placed on both sides of the semiconductor device.
    b) FIMOLO as illustrated in FIG. 23 (see FIGS. 13*a*, 13*b*, 18).
    c) Eventually an auxiliary Finar Buffer element placed between the electrodes having one or both sides insulated or being itself of insulating material. (Augmented FIMED Pressure)

15. A method of Feature set 12, Feature set 13 and Feature set 14 further comprising, active and passive electronic devices, like drivers, resistors, capacitors, optoisolator, inductors, which can be placed and joined to the tracks on the second insulation structure, typically a PCB or a polyimide substrate holding tracks joining the control gate pads to the terminals. (see FIG. 9*g*).

16. A method of Feature set 12 and Feature set 14 further comprising a molded case embedding the structure (see FIGS. 13*b*, 17).

17. A method of Feature set 12 further comprising:
    a) the terminals embedded in part of the case are joined directly to their specific electrodes; (see FIGS. 9*g*, 15, 17)
    b) a cover joined to the upper electrode (see FIGS. 15, 17)

18. A method of Feature set 12, Feature set 13 and Feature set 14 further comprising:
    a) a dry, attach free assembly structure composed by (see FIGS. 13*a*, 13*b*, 14);
    b) an insulating layer like polyimide to keep the chips in respective places (see FIGS. 9*g*, 15);
    c) an insulated grid to keep the Finar Buffer elements in their respective place;
    d) an electrode to support the Finar Buffer elements (see FIGS. 13*a*, 13*b*, 14);
    e) a shaped electrode to include the border sealing (see FIGS. 13*a*, 13*b*, 14);
    f) a case ring including a border to keep the relative distance between the upper electrodes and the lower electrodes (see FIGS. 13*a*, 13*b*, 14);
    g) A substrate in between the upper and lower electrodes connecting distant electrodes and signal lines (see FIG. 13*a*).

19. A method of Feature set 12, Feature set 13 and Feature set 14 further comprising:
    a) a seal between the insulation layer and the case and the electrode and the case. This seal may need to be high enough such that the height of the sealant is higher than the clearance between the case and the HS surface. The case is preferably never directly touch the pressure structure inside;
    b) a soft seal such that the force exerting from it is irrelevant compared to the force distribution between electronic device and the HS.

20. A method of Feature set 12, Feature set 13 and Feature set 14 further comprising: (see FIG. 21);
    a) specialized thermal exchange structure for liquid cooling joined to the insulation layer structure, typically a DCB, facing the liquid cooling pipe;
    b) a specialized thermal exchange structure for liquid cooling shaped to host liquid sealing and piping;
    c) a case ring including the bolt or clamping holes.

21. A method of Feature set 12, Feature set 13 and Feature set 14 further comprising:
    a) a plastic insulation layer like polyimide as insulation substrate to be placed between electrodes and heat sink;
    b) thermal interface material to be placed between the insulation layer and the heat sink. (see FIGS. 9*g*, 15, 17, 18)

22. A method of Feature set 1 and Feature set 2 further comprising: (see FIG. 9*h*):
    a) shaped electrodes to press the Finar Buffer to exert a spatially controlled distributed pressure;
    b) shaped Finar Buffer elements to exert a spatially controlled distributed pressure.

23. A method of Feature set 1 to 12, further comprising: (see FIG. 13*a*):
    a) shaped electrodes to exert pressure on the thyristor gate;
    b) shaped insulation structure, like DCB to exert pressure evenly on the thyristor surface;
    c) shaped electrodes to exert uniform pressure on the thyristor surface;

24. A method of Feature set 1 to 12, further comprising a technique to reduce thermal induced mechanical stress: (see FIG. 9*d*)
    a) An electrode and a DCB are joined by a Finar Buffer
    b) All the angles and/or corners (internal and external), on the horizontal plane of the electrode are rounded (as a reference radius 1 mm), to reduce peak thermally induced mechanical stress;
    c) All the angles and/or corners (internal and external), on the horizontal plane of the DCB are rounded (as a reference radius 1 mm), to reduce thermal mechanical dilatation peak;
    d) A Finar Buffer joins the electrode to its pad on the DCB using solder or silver sinter.

Similarly, the following numbered statements summarize, any one or more of which may be applicable to an embodiment, summarise embodiments of the disclosure:

1. A joint stress relief buffer for handling thermal and/or electrical and/or insulating and/or mechanical contact between potentially all different layers of a sandwich structure of power devices (with or without solder or over attach), more particularly, for handling mechanical stress induced by different thermal expansion coefficients between different layers of a power device. The buffer is characterized by having a significantly lower elastic modulus compared to both the two materials it connects at least in their plane direction, the buffer comprises: a material with strongly anisotropic mechanical properties with low elastic modulus in a horizontal direction (in the plane of said layers) and a higher elastic modulus along a vertical direction, (transverse to said layers) and has a strong hardening behaviour under compression, behaving like a spring between the said layers; wherein the buffer improves the mechanical contact between layers having different thermal expansion coefficients, eventually improving long term reliability; wherein the buffer exerts a high pressure (in excess of 100 MPa and eventually in excess of 1 GPa) that can be exerted directly on the chip; wherein the buffer used in a power device between an active electronic device like a transistor or a diode or a thyristor and a thick metal layer allows for extremely high absolute current, very low current density, uniform current distribution, higher short circuit current, increased short circuit time and more in general high long-term reliability;
2. The use of the buffer of feature set 1 in a power device between an active electronic device like a transistor or a diode or a thyristor and a thick metal layer (and as required between other layers of the sandwich structure) enables FIMOLO, thereby minimizing the thermal resistance between a junction of a power device and a heat sink.
3. The buffer of feature set 1, wherein the material is a sponge-like structure.
4. The buffer of feature set 1, wherein the sponge-like structure is selected from one of a group of sponge-like structures comprising of a metal foam, a collapsed/compressed metal foam, a ceramic foam, a metalized ceramic foam, plastic foam or a plastic structure.
5. The buffer of feature set 1, 2, 3 wherein the buffer has either a uniform density or a spatially distributed density, the latter allowing to spatially define the pressure distribution on the chip, wherein the electrode in contact with the buffer is shaped so as to allow to spatially define the pressure distribution on the chip.
6. The buffer of feature set 1, wherein further, the buffer is preloaded in a compression phase and the hardening behaviour allowing for a slowly changing strain-stress curve and elastic behaviour, to be retained during thermal cycling.
7. Finar Module Optimal Layer Order (FIMOLO) to minimize the thermal resistance between a junction of a power device and a heat sink, this order is as follows: a chip, then a thermally conducting plate to spread the heat flux, then an electric insulator (e.g. DCB) and then a thermal interface material (which typically has low thermal conductivity) between a power device and a heat sink. This optimal layer order places the material at a distance from the thermal power source (chip) in order of thermal conductivity (from highest—closest to the chip, to lowest—farthest from the chip); wherein the low thermally conductive materials are kept as thin as technically possible according to the constrains of the different nature of the device (e.g. insulation requirements, surface planarity and roughness); wherein the high thermally conductive material thickness is such that the thermal flux width is greatly widened as it crosses the low thermally conductive materials (like the DCB and eventually the thermal interface material); wherein the high thermally conductive material thickness is such that the thermal resistance between junction to heat sink is minimized.
8. A method of use of the buffer of feature set 1, wherein the buffer is disposed on one side or both sides of a chip, between the chip and a thick metal electrode (on one side or on both sides) having differing coefficient of thermal expansion, thereby enabling a very reliable electrical and mechanical contact.
9. A method of use of the buffer of feature set 1, feature set 7 and feature set 8, wherein the buffer is disposed between different layers of a sandwich structure, whereby said layers have differing coefficient of thermal expansion, thereby enabling the adoption of FIMOLO.
10. The method of use of the buffer of feature set 1, feature set 7 and feature set 8, wherein the buffer is disposed on both sides of a chip and/or between the other layers of the sandwich structure, thereby enabling FIMOLO with double sided cooling.
11. The method of use of the buffer of feature set 1 to achieve mechanical pressure (a spring effect) within a power device, to achieve FIMED pressure, thereby improving contact between the device and a heat sink thereby reducing TIM thickness.
12. The method of use of the buffer of feature set 1 to achieve a spring effect within a power device, to achieve FIMED pressure, and Augmented FIMED pressure, also to obtain a solderless structure of a power device.
13. The method of use of the structure of feature set 1, 8, 9, 10, 11 whereby all the angles and corners (internal and external), on the horizontal plane of each layer of the sandwich structure are rounded (as a reference radius 1 mm), to reduce peak thermally induced mechanical stress and dilatation.

It will be understood that the particular method and devices embodying the disclosure are shown by way of illustration and not as a limitation of the disclosure. Although certain illustrative embodiments of the disclosure have been shown and described here, a wide range of modification, changes and substitutions is contemplated in the foregoing disclosure.

ADDENDUM

The following documents are incorporated herein by reference:

U.S. Application 3,656,946, filed Apr. 18, 1972, electrical sintering under liquid pressure
ES Application 2078171, filed Jan. 12, 1995, procedimiento de fabrication de modulos de potencia con elementos semiconductors
U.S. Application 6,631,078 B2 Oct. 7, 2003, electronic package with thermally conductive standoff
U.S. Pat. No. 6,397,450 B1, Jun. 4, 2002, method of cooling an electronic power module using a high performance heat exchanger incorporating metal foam therein
U.S. Pat. No. 9,589,922 B2 Mar. 7, 2017, electronic module and method of manufacturing the same
U.S. Application US 2014/0353818 A1, Dec. 4, 2014, power module comprising two substrates and method of manufacturing the same
U.S. Pat. No. 6,903,457 B2, Nov. 13, 2002, power semiconductor device
U.S. Pat. No. 7,683,472 B2, filed Feb. 13, 2007, entitled Power semiconductor modules and method for producing them,
U.S. Pat. No. 8,368,207, filed Apr. 4, 2008, entitled Pressure-contact power semiconductor module and method for producing the same,
U.S. Pat. No. 5,397,245 filed Oct. 29, 1993, entitled Non-destructive interconnect system for semiconductor devices,
U.S. Pat. No. 9,159,701 filed Sep. 17, 2013, entitled Method of manufacturing a chip package, chip package, method of manufacturing a chip assembly and chip assembly, U.S. Pat. No. 6,703,640 filed Feb. 23, 2000, entitled Spring element for use in an apparatus for attaching to a semiconductor and a method of attaching, U.S. Pat. No. 8,432,030 filed Jun. 29, 2011, entitled Power electronic package having two substrates with multiple semiconductor chips and electronic components, U.S. Pat. No. 8,513,798 filed Sep. 9, 2010, entitled Power semiconductor chip package, U.S. Pat. No. 9,082,878 filed Jul. 3, 2013, entitled Method of fabricating a power semiconductor chip package, U.S. Pat. No. 9,691,674 filed Feb. 9, 2015, entitled Semiconductor device and method for manufacturing same, U.S. Pat. No. 9,691,732 filed Aug. 5, 2015, entitled Semiconductor package with elastic coupler and related methods, U.S. Pat. No. 9,691,692 filed May 10, 2016, entitled Semiconductor device, U.S. Pat. No. 9,673,117 filed Jan. 7, 2016, entitled Semiconductor module Nakajima et al. "High Thermal Dissipation Transfer Molded Package for Power Modules", 2004 Electronic Components and Technology Conference Hayashi et al. "Improvement of Fatigue Life of Solder Joints by Thickness Control of Solder with Wire Bump Technique", 2002 Electronic Components and Technology Conference S. B. Park, Rahul Joshi, "Comparison of thermo-mechanical behavior of lead-free copper and tin-lead column grid array packages", Microelectronics Reliability 48 (2008) 763-772

S. Grasso, Y. Sakka, G. Maizza, "Electric current activated/ assisted sintering (ECAS): a review of patents 1906-2008", Schi. Technol. Adv. Mater. 10 (2009) 053001 (24 pp)

M. Yajima et al. Reusable Thermal Conductive Sheet Containing Vertically Oriented Graphite Fillers "TC-S01A", Hitachi Chemical Technical Report No. 53 (2009-10)

B. Ozmat et al. "Thermal Applications of Open Cell Metal Foams", Mat. And Manu. Processes, special edition, Vol. 19, No. 5, pp. 839-862, 2004

J. Evans, J. Y. Evans, "Packaging Factors Affecting the Fatigue Life of Power Transistor Die Bonds", IEEE Trans. On Comp. Pack. Manufact. Tech. PART A, Vol 21, no 3, September 1998, 459

The invention claimed is:

1. A buffer structure to provide stress relief between two layers of an electronic device, the buffer structure comprising:
   a plurality of discrete pillars closely packed together such that there is substantially no air gap between the plurality of conductive pillars, and wherein a height of each pillar is greater than a thickness of said pillar;
   wherein said buffer structure is self-supporting and is derived from a shear deformed foam.

2. A buffer structure according to claim 1, wherein at least some of the pillars are solid pillars; and
   optionally wherein at least some of the pillars are electrically and thermally conductive.

3. A buffer structure according to claim 1, wherein the buffer structure is placed between two layers such that said two layers are distant from one another by the height of each pillar; and
   optionally wherein an electrical current flows along the height of at least some of the pillars.

4. A buffer structure according to claim 1, wherein the pillars are packed together using an adhesive material;
   optionally wherein the adhesive material is selected from a group comprising soft glue, resin, rubber, mold, solder material and volatile glue;
   optionally further comprising a solder material on both sides of the plurality of pillars;
   optionally further comprising an outer frame around the plurality of pillars; and
   optionally wherein the space between the pillars is partially or totally filled with resin, mold, soft solder or a hard solder material.

5. A buffer structure according to claim 1, wherein at least one of:
   (i) a fill factor of at least some of the pillars each are approximately 1;
   (ii) at least some of the pillars have a round cross-section each having a single diameter;
   (iii) at least some of the pillars have a hexagonal cross-section;
   (iv) at least some of the pillars have different thicknesses; and
   (v) at least some of the pillars are filled with a material selected from resin, solder material.

6. A buffer structure according to claim 1, wherein the mechanical and/or electrical connection between the pillars in a lateral direction along the thickness of each pillar is less compared to the mechanical and/or electrical connection in a vertical direction along the height of each pillar.

7. A buffer structure according to claim 1, wherein at least one of:
   (i) the flexibility of the buffer structure is determined by the ratio of the height and diameter or thickness of each pillar, optionally wherein the diameter or thickness of each pillar is less than about 2 mm; and
   (ii) the elastic modulus of the buffer structure is smaller in a horizontal direction along the width of the buffer structure compared to the elastic modulus in a vertical direction along the height of the buffer structure.

8. A buffer structure according to claim 1, wherein the shear deformed foam comprises any one of a metallic foam, a ceramic foam, a metalized ceramic foam and a plastic foam;
   optionally wherein the shear deformed foam is formed by applying a shear force along a height of the foam which results in a tensile force along a thickness of the foam;
   optionally wherein the cells of the shear deformed foam has a substantially 'kite' structure;
   optionally wherein the shear deformed foam is cut into a plurality of pieces along the height of the foam and each piece forms the buffer structure; and
   optionally wherein the shear deformed foam is a heat sink.

9. The buffer structure according to claim 1, wherein the buffer structure is incorporated into a semiconductor device.

10. The buffer structure of claim 9, wherein at least one of:
    (i) the buffer structure comprises a warped thin ceramic structure dividing the buffer structure into an upper portion and a lower portion; and
    (ii) the buffer structure comprises a filled region and an unfilled region directly, and wherein the filled region is configured to act as a heat spreader in the semiconductor device, and wherein the filled region comprises a resin, mold, soft solder or hard solder material filling the space between the pillars of the buffer structure.

11. The buffer structure according to claim 9, wherein the semiconductor device comprises two pieces of metal or non-metal portions, and wherein buffer structure is placed between the two pieces of metal or non-metal to form an elastic and flexible joint, wherein the buffer structure is configured to use as a diffusion attachment to the metal or non-metal portions, and wherein the diffusion attachment is formed using an electric current activated or assisted diffusion sintering technique.

12. The buffer structure according to claim 9, wherein the semiconductor device comprises a semiconductor chip, and wherein the buffer structure is placed in contact with the semiconductor chip; and
optionally wherein the semiconductor device further comprises mold or resin or foam or an elastic element or an embedding material to embed the semiconductor device, optionally further comprising an insulating layer,
wherein the insulating layer is in contact with the buffer structure via the mold or resin, and optionally wherein the insulating layer is a specialised layer such as a direct copper bonding (DCB) element.

13. The buffer structure of claim 9, wherein the buffer structure is configured to use as a spring.

14. A use of a self-supporting buffer structure derived from a shear deformed foam, the buffer structure comprising a plurality of discrete pillars closely packed together such that there is substantially no air gap between the plurality of conductive pillars, and wherein a height of each pillar is greater than a thickness of said pillar, and
wherein the use comprises providing stress relief between two materials having a different thermal expansion coefficient in a sandwiched structure of power semiconductor device.

15. A use according to claim 14, wherein the use comprises at least one of:
(i) handling thermal and/or electrical and/or mechanical contact between different layers of the sandwiched structure;
(ii) providing an anisotropic material for joining two layers of the sandwiched structure;
(iii) providing a heat spreader between two layers of the sandwiched structure;
(iv) providing a spring mechanism to provide pressure on at least one component of the sandwiched structure;
(v) applying a uniform pressure to the at least one component of the sandwiched structure;
(vi) protecting a ceramic structure from a thermal induced stress when the buffer structure is provided on both sides of the ceramic structure;
and (vii) providing a mechanical match making purpose between two layers of the sandwiched structure.

16. A use according to claim 14, wherein the sandwiched structure comprises a semiconductor chip, a metal electrode, an insulation layer, a thermal interface material and a heat sink, and wherein the use comprises providing the buffer structure between at least some of the semiconductor chip, the metal electrode, the insulation layer, the thermal interface material and the heat sink; and
optionally wherein solder, sinter, thermal interface material or other additive attach material is applied to form a fillet around each pillar, wherein the dimensions of the fillets are controlled and optionally wherein the fillets bridge the pillars, the use comprising providing the sandwich structure as a joint buffer.

17. A method of manufacturing a buffer structure for providing stress relief between two materials having different thermal expansion coefficient, the method comprising:
forming a plurality of discrete pillars closely packed together such that there is substantially no air gap between the plurality of conductive pillars, and wherein a height of each pillar is greater than a thickness of said pillar;
wherein said buffer structure is self-supporting and is derived from a shear deformed foam.

18. A method according to claim 17, further comprising packing together the pillars using an adhesive material;
optionally wherein the adhesive material is selected from a group comprising soft glue, resin, rubber, solder material and volatile glue;
optionally further comprising providing a solder material on both sides of the plurality of pillars; and
optionally further comprising providing an outer frame around the plurality of pillars.

19. A method according to claim 17, further comprising:
providing a plurality of discrete wires;
stacking the plurality of discrete wires such that the wires are substantially aligned with one another; and
cutting the plurality of wires along a cross-section of the wires into a plurality of sections, wherein each section of the plurality of wires forms the buffer structure.

20. A method according to claim 17, further comprising forming the buffer structure from a foam block having a plurality of pores and a plurality of wire portions surrounding the pores; and
optionally further comprising applying a shear force along a height of the foam block which results in a tensile force so that the cells of the shear deformed foam have a substantially 'kite' structure, optionally further comprising applying a compression force to the substantially kite structure to flatten the kite structure, optionally wherein the wire portions of the kite structure are closely packed and aligned with one another, optionally further comprising cutting the kite structure into a plurality of pieces along the height of the kite structure and each piece forms the buffer structure.

* * * * *